(12) United States Patent
Kawata et al.

(10) Patent No.: US 7,589,147 B2
(45) Date of Patent: Sep. 15, 2009

(54) RESIN COMPOSITION FOR THERMAL CONDUCTIVE MATERIAL AND THERMAL CONDUCTIVE MATERIAL

(75) Inventors: Yuichi Kawata, Yawata (JP); Naoko Tanaka, Neyagawa (JP)

(73) Assignee: Nippon Shokubai Co., Ltd., Osaka-Shi (JP)

( * ) Notice: Subject to any disclaimer, the term of this patent is extended or adjusted under 35 U.S.C. 154(b) by 563 days.

(21) Appl. No.: 10/557,786

(22) PCT Filed: May 19, 2004

(86) PCT No.: PCT/JP2004/007113

§ 371 (c)(1),
(2), (4) Date: Nov. 18, 2005

(87) PCT Pub. No.: WO2004/101678

PCT Pub. Date: Nov. 25, 2004

(65) Prior Publication Data

US 2007/0027254 A1 Feb. 1, 2007

(30) Foreign Application Priority Data

| May 19, 2003 | (JP) | 2003-140047 |
| May 19, 2003 | (JP) | 2003-140048 |
| Jul. 31, 2003 | (JP) | 2003-283866 |
| Jul. 31, 2003 | (JP) | 2003-283870 |
| Feb. 5, 2004 | (JP) | 2004-029235 |
| Mar. 10, 2004 | (JP) | 2004-067387 |

(51) Int. Cl.
  *C08L 31/00* (2006.01)
(52) U.S. Cl. .................. 524/556; 525/193; 525/309
(58) Field of Classification Search .................. 524/555
  See application file for complete search history.

(56) References Cited

U.S. PATENT DOCUMENTS

| 3,920,605 A | 11/1975 | Sato et al. |
| 5,395,876 A | 3/1995 | Frentzel et al. |
| 5,773,485 A | 6/1998 | Bennett et al. |
| 5,902,836 A | 5/1999 | Bennett et al. |
| 6,204,303 B1 | 3/2001 | Osuna et al. |
| 6,207,272 B1 | 3/2001 | Takahira et al. |
| 6,544,596 B2* | 4/2003 | Clemens et al. .......... 427/407.1 |
| 7,157,526 B2* | 1/2007 | Nickolaus et al. ........... 525/445 |

FOREIGN PATENT DOCUMENTS

| EP | 0 566 093 | 10/1993 |
| EP | 0 865 453 | 9/1998 |
| EP | 0 924 761 | 6/1999 |
| EP | 0 942 060 | 9/1999 |
| GB | 1 493 393 | 11/1977 |
| JP | 59-22961 | 2/1984 |
| JP | 60-84364 | 5/1985 |
| JP | 5-230227 | 9/1993 |
| JP | 9-67495 | 3/1997 |
| JP | 9-132759 | 5/1997 |
| JP | 10-503548 | 3/1998 |
| JP | 10-503802 | 4/1998 |
| JP | 11-92615 | 4/1999 |
| JP | 11-181368 | 7/1999 |
| JP | 11-209431 | 8/1999 |
| JP | 11-269438 | 10/1999 |
| JP | 2000-128911 | 5/2000 |
| JP | 2000-510190 | 8/2000 |
| JP | 2001-240797 | 9/2001 |
| JP | 2001-335602 | 12/2001 |
| JP | 2002-003732 | 1/2002 |
| JP | 2002-26202 | 1/2002 |
| JP | 2002-30212 | 1/2002 |
| JP | 2002-134665 | 5/2002 |
| JP | 2002-155110 | 5/2002 |
| JP | 2002-234952 | 8/2002 |
| JP | 2003-49144 | 2/2003 |
| JP | 2003-133490 | 5/2003 |
| JP | 2003-249609 | 9/2003 |
| JP | 2004-67722 | 3/2004 |
| JP | 2004-339426 | 12/2004 |
| TW | 459031 | 10/2001 |
| WO | 98/13402 | 4/1998 |
| WO | 03/002644 | 1/2003 |
| WO | 03/093336 | 11/2003 |
| WO | 2006/062614 | 6/2006 |

OTHER PUBLICATIONS http://www.gelest.com/applications/CouplingAgentsandComposites.asp.*
Taiwanese Office Action in corresponding Taiwanese Patent Application No. 93114069, issued on Feb. 18, 2008, with English translation.
Notice of Reasons for Refusal dispatched on Apr. 14, 2009 in Japanese Application No. 2003-283866, with English translation.

* cited by examiner

*Primary Examiner*—David Wu
*Assistant Examiner*—Vu Nguyen
(74) *Attorney, Agent, or Firm*—Wenderoth, Lind & Ponack, L.L.P.

(57) ABSTRACT

The present invention is characterized by a resin composition for a thermal conductive material including a polymer (I), a liquid-state plasticizer (II) and a thermal conductive filler (III) having a thermal conductivity of 20 W/m·K or more, wherein the liquid-state plasticizer (II) is in a liquid state at 25° C., and has a mass loss rate of 2 mass % or less when kept at 130° C. for 24 hours. By using this resin composition for a thermal conductive material, it becomes possible to obtain a thermal conductive material having superior thermal conductivity and flexibility.

21 Claims, No Drawings

RESIN COMPOSITION FOR THERMAL CONDUCTIVE MATERIAL AND THERMAL CONDUCTIVE MATERIAL

FIELD OF THE INVENTION

The present invention relates to a resin composition used for obtaining a thermal conductive material, such as a thermal conductive sheet to be applied so as to radiate heat, and more particularly, concerns a resin composition for a thermal conductive material, which is superior in thermal conductivity, flexibility and moldability.

BACKGROUND OF THE INVENTION

A material (thermal conductive sheet), obtained by curing a resin composition prepared by blending a thermal conductive filler for improving thermal conductivity, such as alumina and silica, into a flexible resin so as to form a sheet shape, has been used for an application for radiating heats generated in the electric/electronic part and the like by interposing between a heat-generating body, such as an electric/ electronic part, installed in various electric products such as personal computers and plasma displays, and a heat-radiating body, such as a heat sink, a heat-radiating fin and a metal heat-radiating plate. Generally, in most cases, the surfaces of the heat-generating body and the heat-radiating body are not smooth so that, in order to increase the contact area with them to enhance the thermal conductive efficiency from the heat-generating body to the heat-radiating body, the thermal conductive sheet is required to have flexibility.

Conventionally, silicone rubber and silicone gel have been used as resins having flexibility; however, problems have arisen in which these resins are expensive, the curing process requires a long period of time to cause deterioration in productivity and siloxane having a low molecular weight is generated to cause a contact failure in the electronic parts.

In order to solve the above-mentioned problems, a heat-radiating (thermal conductive) sheet, which is formed by curing a binder containing a copolymer having a glass transition point of −30° C. or less and a monomer having an unsaturated bond, has been proposed (for example, Japanese Patent Application Laid-Open No. 2001-335602). Moreover, aside from this, a non-silicon-based resin composition for a heat-radiating material, which contains a polymerizable monomer mainly composed of an acrylic acid ester monomer having an alkyl group with carbon atoms in a range from 2 to 18, a photopolymerization initiator and a thermal conductive filler, has been proposed (for example, Japanese Patent Application Laid-Open No. 2002-155110). In these inventions, however, although the problem of the contact failure in electronic parts due to generation of siloxane having a low molecular weight is solved, since neither silicone rubber nor silicone gel is used, it is found that the moldability at the time of molding the thermal conductive sheet and the flexibility of the resulting sheet need to be improved, as a result of examinations conducted by the inventors, etc. of the present invention.

Moreover, a thermal conductive sheet, which contains a high-molecular gel such as acrylic gel, a thermal softener that is in a solid state or in a paste state at normal temperature and becomes liquid when heated and a thermal conductive filler (filler agent) has been proposed (for example, Japanese Patent Application Laid-Open No. 2002-234952). However, even this thermal conductive sheet has some room for improvements in flexibility.

Furthermore, an acrylic urethane resin has been known in which an acrylic oligomer having two hydroxyl groups in one molecule and a polyfunctional isocyanate having at least two isocyanate groups in one molecule are used as the resin composition (for example, Japanese Patent Application Laid-Open No. 2002-30212).

In the case when these resins are used for manufacturing thermal conductive sheets, the following problems tend to be raised: the resulting composition has high viscosity to cause deterioration in operability; since it is not possible to blend a thermal conductive filler at a high blending rate, the thermal conductive property of the resulting thermal conductive sheet becomes low; it takes long to disperse the thermal conductive filler uniformly in a resin by kneading, resulting in deterioration in productivity; and since upon manufacturing a composition, the composition is poor in defoaming property for eliminating air mixed therein, bubbles tend to generate in the resulting heat-radiating sheet to cause deterioration in the moldability and thermal conductive performance.

Moreover, for example, a resin composition which has a urethane bond and is used for coating, and which contains a metal organic compound serving as a urethane reactive catalyst and an acidic substance, has been known (for example, Japanese Patent Application Laid-Open No. 2001-240797). However, this document has no description concerning a thermal conductive material, and with respect to the addition of an acidic substance, only its effects as a technique for prolonging the usable time of a coating composition to be cured by using a urethane crosslinking reaction are described therein. Moreover, this document also has no description with respect to a hardness reduction that occurs when the composition is exposed to high temperatures for a long period of time.

Here, (meth)acrylic resins have been widely used as a base resin for a thermal conductive material (Japanese Patent Application Laid-Open No. 2003-49144, the above-mentioned Japanese Patent Application Laid-Open No. 2002-155110, Japanese Patent Application Laid-Open No. 11-269438, etc.); however, in most cases, these (meth)acrylic resins are prepared in the form of a liquid-state resin composition (referred to as acrylic syrup) in which a (meth)acrylic polymer and a monomer are mixed (for example, Japanese Patent Application Laid-Open No. 9-67495, etc.), and the user further subjects this liquid-state resin composition to a thermal polymerization (radical polymerization) process or a crosslinking (curing) process with a crosslinking agent to form a net-work structure so that a final (meth)acrylic resin product (a molded product, a sheet, etc.) is formed. Here, a method has also been known in which a (meth)acrylic resin is manufactured by using a special catalyst (Japanese Patent Application Laid-Open No. 2000-128911, etc.)

With respect to acrylic syrups of this type, those syrups have been known in which, for example, a (meth)acrylic monomer is polymerized in toluene, and after toluene has been removed, a (meth)acrylic monomer is added thereto to form a liquid-state resin (syrup) and the syrup is polymerized by using a polymerization initiator (see Examples 7 to 9 in the above-mentioned Japanese Patent Application Laid-Open No. 9-67495). Moreover, the above-mentioned Japanese Patent Application Laid-Open No. 2003-49144 has disclosed a method in which a (meth)acrylic monomer is radical-polymerized in ethyl acetate, and after the resulting matter has been applied on a PET film, the PET film is dried. However, the (meth)acrylic resins, obtained by these methods, contain a solvent (toluene, ethyl acetate, etc.). In other words, although these methods remove the solvent in the middle of the processes, it is impossible to remove the solvent completely. When the (meth)acrylic resin thus obtained is used, there is a possibility that the residual solvent might evaporate even little by little, and the possibility becomes greater in the case of applications (thermal conductive materials and the like) in which heat is imposed.

The objective of the present invention is to solve the above-mentioned conventional problems, and consequently to provide a resin composition for a thermal conductive material that is superior in moldability, and the thermal conductive material that exerts a superior thermal conductivity and flexibility for a long period of time.

DISCLOSURE OF THE INVENTION

The present invention relates to a resin composition for a thermal conductive material, which contains a polymer (I), a liquid-state plasticizer (II) and a thermal conductive filler (III) having a thermal conductivity of 20 W/m·K or more, and the liquid-state plasticizer (II) is in a liquid state at 25° C., and has a mass loss rate of 2 mass % or less, when kept at 130° C. for 24 hours therein.

BEST MODE FOR CARRYING OUT THE INVENTION

A resin composition for a thermal conductive material of the present invention (hereinafter, referred to simply as "resin composition") contains a polymer (I), a liquid-state plasticizer (II) and a thermal conductive filler (III) having a thermal conductivity of 20 W/m·K or more. By curing this resin composition, a flexible cured product in which the liquid-state plasticizer (II) is held among crosslinking network of the polymer (I) is obtained, and this cured product is a thermal conductive material. In the present specification, compound groups denoted by different codes indicate different compound groups unless otherwise indicated.

First, the following description will explain the liquid-state plasticizer (II) that is an essential component of the resin composition of the present invention. This liquid-state plasticizer (II), which is in a liquid state at 25° C. and is not mixed with water, is a compound capable of plasticizing the polymer (I). With respect to the above-mentioned liquid-state plasticizer (II), those having a high heat-resistant property are preferably used so as to allow the resulting cured product of the resin composition to exert its flexibility stably for a long period of time. With respect to the scale for the heat-resistant property, the present invention uses the mass loss rate (%) [=100×(mass prior to the holding process−mass after the holding process)/mass prior to the holding process] obtained after the liquid-state plasticizer (II) has been held at 130° C. for 24 hours. Here, the present invention uses the liquid-state plasticizer (II) in which this mass loss rate is set to 2 mass % or less. The mass loss rate is preferably set to 1 mass % or less, more preferably to 0.5 mass % or less, most preferably to 0.1 mass % or less. With respect to the mass loss rate, for example, a liquid-state plasticizer of about several grams is put into a container made of a fire-proof material such as aluminum, and kept under an atmosphere of 130° C. for 24 hours, and masses before and after the storing are measured to determine the rate.

With respect to liquid-state plasticizer (II), low viscosity is included in its preferable requirements. For example, the viscosity at 25° C. is preferably set to 1000 mPa·s or less, more preferably to 800 mPa·s or less, most preferably to 500 mPa·s or less, by far the most preferably to 300 mPa·s, and those having a viscosity value in this level are preferably used. Here, the viscosity of liquid-state plasticizer (II) is measured by using, for example, a B-type viscometer made by Tokyo Keiki Co., Ltd.. The following Table 1 shows a relationship between a combination of rotor Nos. and numbers of revolutions and an upper limit value of the measurable viscosity for this B-type viscometer, and as the actually measured viscosity becomes closer to the upper limit value, the measurement error can be reduced. In the case when the approximate viscosity of a subject to be measured has been known, the combination between rotor No. to be used and the number of revolutions is determined by reference to this Table 1. In contrast, in the case when the approximate viscosity is unclear, rotor No. is changed from the bigger value to the smaller value, with the number of revolutions being changed from the low speed side to the high speed side, while the relationship in the following Table 1 is taken into consideration, so that measurements are carried out in an appropriate range.

TABLE 1

|  | Number of revolutions 60 rpm | Number of revolutions 30 rpm | Number of revolutions 12 rpm | Number of revolutions 6 rpm |
| --- | --- | --- | --- | --- |
| Rotor No. 1 | 100 mPa · s | 200 mPa · s | 500 mPa · s | 1000 mPa · s |
| Rotor No. 2 | 500 mPa · s | 1000 mPa · s | 2500 mPa · s | 5000 mPa · s |
| Rotor No. 3 | 2000 mPa · s | 4000 mPa · s | 10000 mPa · s | 20000 mPa · s |
| Rotor No. 4 | 10000 mPa · s | 20000 mPa · s | 50000 mPa · s | 100000 mPa · s |

With respect to liquid-state plasticizer (II), specific examples thereof include: a phthalic acid ester-based plasticizer, a pyromellitic acid ester-based plasticizer, a trimellitic acid ester-based plasticizer, an adipic acid ester-based plasticizer, a polyester-based plasticizer, an epoxy-based plasticizer, a phosphoric acid ester-based plasticizer and a rubber-use plasticizer. Two or more kinds of these may be used in combination.

In most cases, plasticizers, which are superior in heat resistance and satisfy the above-mentioned requirements for the mass loss rate, are selected from liquid-state plasticizers having an aromatic ring (in particular, a benzene ring), and examples thereof include: phthalic acid esters, that is, phthalic acid di-$C_{8-15}$ alkyl esters (preferably, phthalic acid d-$C_{9-13}$ alkyl esters) such as didecyl phthalate, diundecyl phthalate, and didodecyl phthalate. With respect to trimellitic acid esters, examples thereof include trimellitic acid tri-$C_{7-14}$ alkyl esters (preferably, trimellitic acid tri-$C_{8-12}$ alkyl esters), such as octyl trimellitate, trinonyl trimellitate, and tridecyl trimellitate. With respect to pyromellitic acid esters, examples thereof, in many cases, correspond to pyromellitic acid tetra-$C_{6-13}$ alkyl esters (preferably, pyromellitic acid tetra-$C_{7-10}$ alkyl esters), such as tetraoctyl pyromellitate, and with respect to phosphoric acid esters, examples thereof correspond to triphenyl phosphates in which a benzene ring may be substituted by a $C_{1-3}$ alkyl group, such as cresyldiphenyl phosphate, tricresyl phosphate and trixylenyl phosphate.

With respect to the above-mentioned liquid-state plasticizer (II), commercially available products may be used, and examples thereof include: dinormal decyl phthalate [Vinycizer 105, made by Kao Corporation, etc.], di-$C_{10-12}$ alkyl phthalate [Vinycizer 124, made by Kao Corporation, etc.], trimellitic acid tri-2-ethylhexyl trimellitate [Trimex T-08, made by Kao Corporation, etc.], trioctyl trimellitate [ADK-Cizer C-8, made by Asahi Denka Co., Ltd., etc], trinormaloctyl trimellitate [Trimex N-08 and Trimex New-NSK, made by Kao Corporation, and ADK-Cizer C-880, made by Asahi Denka Co., Ltd., etc.], triisononyl trimellitate [ADK-Cizer C-9N, made by Asahi Denka Co., Ltd., etc], trimellitic acid triisodecyl trimellitate [Trimex T10, made by Kao Corporation; ADK-Cizer C-10, made by Asahi Denka Co., Ltd., etc.], trimellitic acid mixed alcohol ester [ADK-Cizer C-79, ADK-Cizer C-810, made by Asahi Denka Co., Ltd., etc], tetraocryl pyromellitate [ADK-Cizer UL-80, made by Asahi Denka Co., Ltd., etc], pyromellitic acid mixed alcohol ester [ADK-Cizer UL-100, made by Asahi Denka Co., Ltd., etc], cresyldiphenyl phosphate [Kronitex CDP, made by Ajinomoto-Fine-Techno Co., Inc. etc.], tricresyl phosphate [Kronitex TCP, made by Ajinomoto-Fine-Techno Co., Inc. etc.], and trixylenyl phosphate [Kronitex TXP, made by Ajinomoto-Fine-Techno Co., Inc. etc.]. Each of these liquid-state plasticizers (II) may be used alone, or two or more kinds of these may be used in combination.

The following description will explain the polymer (I) contained in the resin composition of the present invention. The polymer (I) includes a (meth)acrylic polymer (I-a) and a crosslinking polymer (I-b). When the (meth)acrylic polymer (I-a) is used as the polymer (I), the resin composition preferably contains a polymerizable monomer (IV).

The (meth)acrylic polymer (I-a) refers to a polymer in which 50% by mass or more (preferably, 70% by mass or more, most preferably, 80% by mass or more) of constituent units is composed of (meth)acrylic acid esters. Moreover, the "methacrylic polymer" refers to a polymer in which the portion exceeding 50% by mass of the above-mentioned (meth) acrylic acid esters is composed of methacrylic acid esters. The "acrylic polymer" refers to a polymer in which the portion exceeding 50% by mass of the above-mentioned (meth) acrylic acid esters is composed of acrylic acid esters. Moreover, the polymer contains binary or more copolymers.

With respect to the monomer to be used for manufacturing the (meth)acrylic polymer (I-a), (meth)acrylic acid esters and (meth)acrylic acid alkyl esters in which an alkyl group is substituted by a functional group (such as a carboxyl group and a hydroxyl group) are preferably used. With respect to the (meth)acrylic acid alkyl esters, examples thereof include: ethyl(meth)acrylate, propyl(meth)acrylate, butyl(meth)acrylate, amyl(meth)acrylate, hexyl(meth)acrylate, octyl(meth) acrylate, nonyl(meth)acrylate, decyl(meth)acrylate, lauryl (meth)acrylate, tridecyl(meth)acrylate, myristyl(meth) acrylate and stearyl(meth)acrylate. With respect to the above-mentioned (meth)acrylic acid alkyl esters, not limited to those having a straight-chain (normal) alkyl group, those having a branched chain alkyl group may be used, and, for example, those having an iso-type or those in which an alkyl group is substituted by a lower alkyl group (for example, an alkyl group having 1 to 3 carbon atoms) [for example, ethylhexyl (meth)acrylate] may be used.

Among these, in order to improve the flexibility of the cured product (thermal conductive material) of the resin composition, (meth)acrylic acid esters in which the number of carbon atoms in the alkyl group moiety (when substituted by a lower alkyl group, the total number of carbon atoms) is in a range of about 2 to 18 (more preferably, about 3 to 15) are preferably used. Each of these monomers may be used alone, or a plurality of these may be used in combination. In the case when a plurality of these monomers are combined with one another, a plurality of (meth)acrylic acid alkyl esters may be combined, and, for example, (meth)acrylic acid alkyl esters may be used in combination with (meth)acrylate containing a functional group, such as hydroxyethyl(meth)acrylate and (meth)acrylic acid. When such (meth)acrylate containing a functional group is used, the resulting (meth)acrylic polymer (I-a) is allowed to have improved wettability and the like to the thermal conductive filler (III). The (meth)acrylic polymer (I-a) obtained by using such (meth)acrylate containing a functional group may be referred to as a crosslinking polymer (I-b), which will be described later; however, since the functional group should not be consumed by the crosslinkage or the like in order to exert wettability improving effects and the like, a crosslinking agent (VI) is not added to the resin composition using the (meth)acrylic polymer (I-a).

Upon manufacturing the (meth)acrylic polymer (I-a), it is preferable to use 50 mass % or more of (meth)acrylic acid alkyl esters with the number of carbon atoms in the alkyl group being in a range of 2 to 18 relative to 100% by mass of the monomer component constituting the (meth)acrylic polymer (I-a); it is more preferable to use 70 mass % or more thereof, and it is most preferable to use 80 mass % or more thereof. Thus, it becomes possible to improve the flexibility of the thermal conductive material after the curing process, and also to improve the heat-transmitting area and the follow-up property to a subject to be attached. Moreover, since the amount of use of the plasticizer is reduced, it also becomes possible to prevent the plasticizer from bleeding out.

The glass transition point of the (meth)acrylic polymer (I-a) is preferably set to 0° C. or less, more preferably to −30° C. or less, still more preferably to −40° C. or less. When the glass transition point exceeds 0° C., the resulting cured product of the resin composition tends to have insufficient flexibility. Here, the glass transition point of the (meth)acrylic polymer (I-a) can be measured through a commonly-used method by using a differential scanning calorimeter.

With respect to the molecular weight of the (meth)acrylic polymer (I-a), the weight-average molecular weight, obtained by the gel-permeation chromatography (GPC) method on the basis of calibration with polystyrene, is preferably set in a range from 10,000 to 1,000,000, more preferably, from 30,000 to 800,000, most preferably, from 50,000 to 500,000. When the weight-average molecular weight is less than 10,000, the resulting cured product of the resin composition has degradation in performances such as a solvent-resistant property and a heat-resistant property, and, in contrast, the weight-average molecular weight exceeding 1,000,000 may cause high viscosity of the resulting (meth)acrylic polymer (I-a), resulting in a problem with the operability upon molding the resin composition.

In the case when the polymer (I) corresponds to the (meth) acrylic polymer (I-a), the resin composition is preferably allowed to contain a polymerizable monomer (IV). Thus, the viscosity of the resin composition is lowered so that the moldability is enhanced. This polymerizable monomer (IV) is polymerized by a radical polymerization initiator (V) that is added thereto prior to the curing process of the resin composition so that it functions so as to cure the resin composition.

Supposing that the total of the (meth)acrylic polymer (I-a) and polymerizable monomer (IV) is 100% by mass, it is preferable to adjust the (meth)acrylic polymer (I-a) to a range from 10 to 80% by mass, with the polymerizable monomer (IV) being set in a range from 20 to 90% by mass. The ratio is more preferably set in a range from 15 to 70% by mass for the (meth)acrylic polymer (I-a) with the polymerizable monomer (IV) being set in a range from 30 to 85% by mass, and the ratio is most preferably set in a range from 30 to 60% by mass for the (meth)acrylic polymer (I-a) with the polymerizable monomer (IV) being set in a range from 40 to 70% by mass. In the case when the (meth)acrylic polymer is less than 10% by mass, that is, when the polymerizable monomer (IV) exceeds 90% by mass, for example, upon pre-forming into a sheet shape or upon molding, after the kneading process with a thermal conductive filler, a separation undesirably tends to occur between the resin and the thermal conductive filler, failing to provide a desirable method; in contrast, in the case when the (meth)acrylic polymer exceeds 80% by mass, that is, when the polymerizable monomer (IV) is less than 20% by mass, the viscosity of the resin composition becomes too high, undesirably resulting in deterioration in operability, degradation in the surface smoothness of the resulting sheet after the performing process and degradation in surface smoothness upon molding.

With respect to the polymerizable monomer (IV), although not particularly limited as long as it is a monomer having one radical polymerizable double bond, among those, (meth)acrylic acid alkyl esters having an alkyl group with carbon atoms of 2 to 18, which have been exemplified as a monomer to be used upon manufacturing the (meth)acrylic polymer (I-a), are preferably used. Two kinds or more of these may be used in combination. The amount of use of the (meth)acrylic acid alkyl esters having an alkyl group with carbon atoms of 2 to 18 is preferably set to 80% by mass or more in 100% by mass of the polymerizable monomer (IV) component.

If necessary, a monomer (hereinafter, referred to as "polyfunctional monomer") that has two or more radical polymerizable double bonds in one molecule may be used in one portion of the polymerizable monomer (IV). By using the polyfunctional monomer, it becomes possible to obtain a cured product that is superior in heat resistance, chemical resistance and creep property; therefore, the use thereof is desirably determined depending on required performances of the cured product. Supposing that the total of the (meth)acrylic polymer (I-a) and polymerizable monomer (IV) is 100 parts by mass, the amount of use of the polyfunctional monomer is preferably set to 5 parts by mass or less, more preferably, to 4 parts by mass or less, still more preferably, to 3 parts by mass. When the amount of the polyfunctional 5 monomer exceeds 5 parts by mass, the resulting cured product of the resin composition may become poor in its flexibility.

Specific examples of the polyfunctional monomer include a polyfunctional (meth)acrylic monomer, divinyl benzene, diallyl phthalate and triallyl cyanurate. Examples of the polyfunctional (meth)acrylic monomer include: di(meth)acrylates (preferably, $C_{2-8}$alkanediol di(meth)acrylate), such as (poly)ethyleneglycol di(meth)acrylate, (poly)propyleneglycol di(meth)acrylate, 1,4-butanediol di(meth)acrylate, neopentylglycol di(meth)acrylate and 1,6-hexanediol di(meth)acrylate; tri(meth)acrylates such as trimethylol propane tri(meth)acrylate; tetra(meth)acrylates such as pentaerythritol tetra(meth)acrylate; and condensates of the above-mentioned di, tri and/or tetra(meth)acrylates, such as dipentaerythritol hexa(meth)acrylate. Each of the above-mentioned polyfunctional polymerizable monomers may be used alone, or two or more kinds of them may be used in combination.

The above-mentioned (meth)acrylic polymer (I-a) can be obtained by allowing the above-mentioned material monomer to undergo a polymerizing reaction through a known radical polymerization method, such as bulk polymerization, solution polymerization and emulsion polymerization. In the bulk polymerization method, when a partial polymerization method in which the polymerization is stopped in the middle of the process is adopted, a mixture of the polymer (I-a) and the polymerizable monomer (IV) is obtained in one process so that it becomes possible to provide a convenient method desirably. Of course, the polymerizable monomer (IV) may be added to this mixture in a separate manner so as to be adjusted. Moreover, by adopting the solution polymerization method or the emulsion polymerization method, water content, solvents and the like are evaporated after the polymerization of the (meth)acrylic polymer (I-a) has been completed, and the polymerizable monomer (IV) may be added thereto.

Moreover, the material monomer of the (meth)acrylic polymer (I-a) may be polymerized in the presence of the liquid-state plasticizer (II). This process makes it possible to easily control the polymerization rate in comparison with the bulk polymerization, and also to prevent impurities such as water content and solvents from entering the resin composition. In this case, after all the material monomer of the (meth)acrylic polymer (I-a) has been polymerized, the polymerizable monomer (IV) may be added thereto separately, and, if necessary, the liquid-state plasticizer (II) may be further added thereto. Moreover, the polymerization of the material monomer of the (meth)acrylic polymer (I-a) may be terminated in the middle of the polymerization process, and this method makes it possible to obtain a mixture of the (meth)acrylic polymer (I-a), the polymerizable monomer (IV) and the liquid-state plasticizer (II) through one process. Of course, the polymerizable monomer (IV) and the liquid-state plasticizer (II) may be added to this mixture in a separate manner so as to adjust the compounding ratio.

Upon polymerization, a radical polymerization initiator is used. This radical polymerization initiator may be the same as the radical polymerization initiator (V) that is added separately to the resin composition containing the (meth)acrylic polymer (I-a) and the polymerizable monomer (IV) and used for polymerizing the polymerizable monomer (IV), or may be different therefrom; however, since this initiator is consumed through the polymerization reaction, the polymerization initiator (V) is separately added to the resin composition at an appropriate timing after the reaction.

With respect to the radical polymerization initiator (V), examples thereof include thermal polymerization initiators and the like, such as an azo-based initiator and an organic peroxide, and each of these may be used alone or two or more kinds of these may be used in combination.

With respect to the azo-based initiator, examples thereof include: 2,2'-azobisisobutyronitrile, dimethyl-2,2'-azobis(2-methyl propionates) and 2-phenylazo-2,4-dimethyl-4-methoxy valeronitrile.

With respect to the organic peroxide, examples thereof include: ketone peroxides, such as methyl ethyl ketone peroxide; hydroperoxides, such as cumene hydroperoxide; diacyl peroxides, such as benzoyl peroxide and lauryl peroxide; dialkyl peroxides, such as dicumyl peroxide; peroxyketals, such as 1,1-di-t-butylperoxy-3,3,5-trimethylcyclohexane; alkyl peresters, such as t-amylperoxy-2-ethylhexanate, t-butylperoxy-2-ethylhexanate, t-amylperoxy-3,5,5-trimethylhexanate, 1,1,3,3-tetramethylbutylperoxy-2-ethylhexanate, 1,1,3,3-tetramethylbutylperoxy-2-ethylhexanate, t-butylperoxy-3,5,5-trimethylhexanate and t-butylperoxy pivalate; and percarbonates, such as t-butylperoxyisopropyl carbonate, t-butylperoxy-2-ethylhexyl carbonate, 1,6-bis(t-butylperoxycarbonyloxy) hexane.

Although not particularly limited as long as it allows (meth)acrylic acid esters to undergo a radical polymerization reaction, the amount of use of the radical polymerization initiator is appropriately set depending on the kinds of the radical polymerization initiator, and with respect to 100 parts by mass of the material monomer, it is approximately set, for example, in a range of 0.01 to 1 part by mass, more preferably, 0.05 to 0.7 part by mass, most preferably, 0.10 to 0.5 part by mass. Here, the radical polymerization initiator may be appropriately divided and then added, if necessary, or may be added after having been diluted by the liquid-state plasticizer (II).

Upon polymerization, a chain transfer agent may be added, if necessary. With respect to the chain transfer agent, various known chain transfer agents may be used, and examples thereof include: a-methylstyrene dimer, carbon tetrachloride and thiol compounds (for example, n-dodecylmercaptan). The amount of use of the chain transfer agent is appropriately set on demand, and, for example, it is set in a range from about 0.01 to 2 parts by mass, more preferably, about 0.05 to 1.5 parts by mass, still more preferably, about 0.10 to 1 part by mass, with respect to 100 parts by mass of the material monomer.

The reaction temperature may also be set on demand, and for example, it is set in a range from about 40 to 150° C., more preferably, about 50 to 100° C., in most cases.

When the polymer (I) corresponds to the (meth)acrylic polymer (I-a), the radical polymerization initiator (V) is preferably contained in the resin composition together with the polymerizable monomer (IV). The presence of the polymerization initiator (V) makes it possible to cure the resin composition quicker to improve the productivity of the thermal conductive material. With respect to the radical polymerization initiator (V), in addition to the aforementioned conventionally known thermal polymerization initiators, photo initiators and the like may be used. For example, upon curing the resin composition by using heat, the thermal polymerization initiator may be used, and upon curing the resin composition by using ultraviolet rays, the photo initiator may be used for the curing process; thus, the initiator is appropriately selected depending on curing methods on demand. Of these methods, the method for curing the resin composition by using heat is more preferable because its curing device is simpler, and superior from the viewpoint of costs, and it is more preferable to cure the resin composition by using a thermal polymerization initiator. In order to accelerate the function of the thermal polymerization initiator, known curing accelerator and curing acceleration assistant may be used. The amount of addition of the thermal polymerization initiator is preferably set in a range of 0.1 to 5 parts by mass, the amount of the curing accelerator is set in a range of 00.5 to 3 parts by mass, and the amount of the curing acceleration assistant is set in a range of 0.05 to 2 parts by mass, with respect to the total 100 parts by mass of the (meth)acrylic polymer (I-a) and the polymerizable monomer (IV).

In the case when the polymer (I) corresponds to the (meth) acrylic polymer (I-a), with respect to the resin composition, supposing that the total of the liquid-state plasticizer (II), the (meth)acrylic polymer (I-a) and polymerizable monomer (IV) is 100% by mass, it is preferable to adjust the liquid-state plasticizer (II) within a range of 5 to 60% by mass (more preferably, 15 to 40% by mass, the (meth)acrylic polymer (I-a) within a range of 10 to 60% by mass (more preferably, 10 to 50% by mass) and the polymerizable monomer (IV) within a range of 30 to 85% by mass (more preferably, 40 to 65% by mass).

In the case when the liquid-state plasticizer (II) is less than 5% by mass, the hardness of the resulting cured product of the resin composition tends to become higher, failing to provide proper flexibility required for the thermal conductive material, and in the case when the liquid-state plasticizer (II) exceeds 60% by mass, although the resulting cured product of the resin composition has improved flexibility, the liquid-state plasticizer (II) tends to be separated from the cured product.

In the case when the (meth)acrylic polymer (I-a) is less than 10% by mass, for example, upon molding the resulting resin composition into a thermal conductive sheet (upon curing), a separation tends to occur between the resin and the other components, and in the case when the (meth)acrylic polymer (I-a) exceeds 60% by mass, the viscosity of the resulting resin composition tends to become too high, resulting in deterioration in operability and degradation in the surface smoothness of the resulting sheet.

In the case when the polymerizable monomer (IV) is less than 30% by mass, the liquid-state plasticizer (II) tends to be separated from the resulting cured product of the resin composition, and in contrast, in the case when the polymerizable monomer (IV) exceeds 85% by mass, the resin tends to be separated from the other components.

The following description will discuss the case in which the polymer (I) corresponds to the crosslinking polymer (I-b). The crosslinking polymer (I-b) is a polymer that has a functional group that is allowed to react with the crosslinking agent (VI) so that a cured product (thermal conductive material) is formed by crosslinking through the reaction with the crosslinking agent (VI).

The crosslinking polymer (I-b) is obtained by copolymerizing a polymerizable monomer (I-b-1) with a polymerizable monomer (I-b-2) having a functional group used for a crosslinking process. The polymerizable monomer (I-b-1) is a polymerizable monomer having one radical polymerizable unsaturated group in its molecule. This monomer (I-b-1) has no functional group capable of reacting with the crosslinking agent (VI). Here, the polymerizable monomer (I-b-2) is a monomer having one functional group used for crosslinking and one radical polymerizable unsaturated group in its molecule.

The polymerizable monomer (I-b-1) is not particularly limited as long as it is a monomer that contains one radical polymerizable unsaturated group in its molecule. More specifically, (meth)acrylic acid alkyl esters having an alkyl group with carbon atoms of 2 to 18 are preferably used in the same manner as the polymerizable monomer (IV). The amount of use of the (meth)acrylic acid alkyl ester having an alkyl group with carbon atoms of 2 to 18 is preferably set to 50% by mass or more, more preferably, to 70% by mass or more, most preferably, to 80% by mass or more, with respect to 100% by mass of the monomer components forming the crosslinking polymer (I-b).

With respect to the functional group-containing polymerizable monomer (I-b-2), any monomer may be used as long as it contains one functional group used for crosslinking and one radical polymerizable unsaturated group in its molecule. With respect to the functional group, examples thereof include: a carboxyl group, a hydroxyl group, a mercapto group, a nitrile group, an amino group, an amide group, a carboxylic anhydride group, an epoxy group and an isocyanate group. Among these, the hydroxyl group is preferably used. With respect to specific hydroxyl group containing monomers, examples thereof include: 2-hydroxyethyl(meth)acrylate, 2-hydroxypropyl(meth)acrylate, 2-hydroxybutyl(meth)acrylate, polyethyleneglycol mono(meth)acrylate, polypropyleneglycol (meth)acrylate, glycerin(meth)acrylate and hydroxystyrene.

In the case when the polymerizable monomer (I-b-1) and the functional group-containing polymerizable monomer (I-b-2) are polymerized with each other, the rate of the functional group-containing polymerizable monomer (I-b-2) is preferably set in a range from 0.01 to 5 mole %, more preferably, from 0.1 to 4 mole %, most preferably, from 0.3 to 3 mole %, with respect to the total 100 mole % of the two components. When the functional group-containing polymerizable monomer (I-b-2) exceeds 5 mole %, the resulting cured product (thermal conductive material) may have deterioration in its flexibility, and when it is less than 0.01 mole %, the liquid-state plasticizer (II) is not held in the cured product after the crosslinking process, sometimes failing to form a gel state.

The glass transition point of the crosslinking polymer (I-b) is preferably set to 0° C. or less, more preferably, to −20° C. or less, still more preferably, to −30° C. or less. When the glass transition point exceeds 0° C., the resulting resin composition may fail to have sufficient flexibility.

With respect to the molecular weight of the crosslinking (meth)acrylic polymer (I-b), the mass-average molecular weight (Mw), obtained by the gel-permeation chromatography (GPC) method on the basis of calibration with polystyrene, is preferably set in a range from 50,000 to 2,000,000, more preferably, from 80,000 to 1,500,000, most preferably, from 100,000 to 1,000,000. When the mass-average molecular weight Mw is less than 50,000, it takes a long time to obtain the cured product, and it becomes difficult for the cured product to form a gel-state resin. In contrast, Mw exceeding 2,000,000 may cause a high viscosity in the resin composition, resulting in a problem with the operability.

The crosslinking polymer (I-b) can be manufactured by using the same method as the synthesis method of the aforementioned (meth)acrylic polymer (I-a). Moreover, it can also be synthesized in the liquid-state plasticizer (II). Here, it is not necessary for the crosslinking polymer (I-b) to be partially polymerized and the polymerization reaction is to be completed.

With respect to the crosslinking agent (VI), any compound may be used as long as it has two or more functional groups used for crosslinking in its molecule, without having a radical polymerizable unsaturated group, and it is selected on demand depending on the functional group possessed by the crosslinking polymer (I-b), that is, on the kinds of the functional group of the functional group-containing polymerizable monomer (I-b-2). For example, when the crosslinking polymer (I-b) is obtained by using a monomer having a hydroxyl group as the functional group-containing polymerizable monomer (I-b-2), those compounds having two or more isocyanate groups in the molecule are preferably used as the crosslinking agent (VI). Examples thereof include: hexamethylene diisocyanate, isophorone diisocyanate, p-phenylene diisocyanate, 2,6-toluene diisocyanate, 2,4-toluene diisocyanate, bis(4-isocyanatecyclohexyl) methane, a trimethylolpropane adduct of toluene diisocyanate, an isocyanurate modified form of toluene diisocyanate, an HDI-based oligomer, an isocyanurate modified form, a biuret-modified form and a uretodione form of HDI, and an isocyanurate modified form of IPDI. Only one kind of these may be used, or two or more kinds of these may be used in combination. Moreover, the isocyanate group in the crosslinking agent (VI) may be blocked by c-caprolactum, butanone oxium or phenol. Here, an isocyanate-group-containing (co)polymer, which is obtained by (co)polymerizing a monomer having an isocyanate group with another monomer, if necessary, may be used as the crosslinking agent (VI), and in this case, the (co)polymer is preferably allowed to have a mass-average molecular weight of 500,000 or less and to be in a liquid-state at 25° C., with a viscosity of 8000 mPa·s or less. With respect to the monomer having an isocyanate group, examples thereof include 2-methacryloyloxyethyl isocyanate, methacryloyl isocyanate and the like; however, the monomer is not particularly limited to these. Only one kind of the isocyanate-containing monomer may be used, or two or more kinds of these may be used in combination. Moreover, the isocyanate group in the monomer may also be blocked.

The crosslinking agent (VI) is set in a range from 0.1 equivalents or more (more preferably, 0.5 equivalents or more, most preferably, 0.7 equivalents or more) to 2.0 equivalents or less (more preferably, 1.8 equivalents or less, still more preferably, 1.5 equivalents or less) with respect to 1 equivalent of the functional group of the crosslinking polymer (I-b).

A preferable combination between the functional group of the functional group-containing polymerizable monomer (I-b-2) and the functional group of the crosslinking agent (VI) is formed between at least one functional group selected from the group consisting of a carboxyl group, a hydroxyl group, a mercapto group, an amino group and an amide group and at least one functional group selected from the group consisting of a carboxylic anhydride group, an epoxy group and an isocyanate group. The combination of the functional group-containing-polymerizable monomer (I-b-2) and the crosslinking agent (VI) is appropriately determined based upon the above-mentioned combinations so that unreacted functional groups in the resulting cured product can be reduced.

The most preferable combination is a combination between the functional group-containing polymerizable monomer (I-b-2) having a hydroxyl group and the crosslinking agent (VI) having an isocyanate group. By using this combination, the curing reaction can be carried out at a lower temperature in a shorter period of time, making it possible to achieve a reaction that is superior in economical efficiency.

In the case when the polymer (I) corresponds to the crosslinking polymer (I-b), the resin composition preferably contains a crosslinking accelerator or crosslinking acceleration assistant used for accelerating the crosslinking reaction. In particular, when the functional group-containing polymerizable monomer (I-b-2) having a hydroxyl group and the crosslinking agent (VI) having an isocyanate group are combined with each other, the reaction is preferably carried out by using an organic metal compound as the crosslinking accelerator. With respect to the organic metal compound, any organic metal compound may be used as long as it has a transition metal element belonging to 3A to 7A, 8 and 1B groups and a metal element belonging to 2B to 6B in the Periodic Table described in Chemistry Handbook Application $3^{rd}$ Revised Edition (edited by Japan Chemical Society, published by Maruzen Co., Ltd.), and it is selected on demand depending on the reaction time, the reaction temperature, the composition of the resin composition and the like. Among these, compounds of tin, zinc or lead are preferably used, and tin compounds are more preferably used. Only one kind of these organic metal compounds may be used, or two or more kinds of these may be used in combination. Specific examples thereof include: organic tin compounds, such as dibutyltin dilaurate, dibutyltin diacetate, dibutyltin di(2-ethylhexanoate), dihexyltin diacetate, dioctyltin dilaurate, dimethyltin bis(isooctyl thioglycolic acid ester)salt and tin octylate; organic zinc compounds, such as zinc naphthenate and 2-ethylhexyl zinc; and organic lead compounds, such as lead stearate, lead naphthenate and 2-ethylhexyl lead.

Moreover, upon carrying out a crosslinking reaction, the crosslinking accelerator of this type is preferably used in combination with a compound having an atom with a pair of isolated electrons in its molecule. Consequently, this compound having an atom with a pair of isolated electrons in its molecule is preferably blended in the resin composition. This is because the inventors of the present invention have found the phenomenon that, when an accelerated test in which a thermal conductive sheet made of the resin cured product of this type has been held under high temperature for a long time is carried out, the sheet hardness is lowered, and also found that in order to suppress the phenomenon, it is effective to combindly use the above-mentioned organic metal compound and the compound having an atom with a pair of isolated electrons in its molecule, upon carrying out the crosslinking process. Presumably, the sheet hardness is lowered because molecular chains of the crosslinking polymer, which have been swollen by the liquid-state plasticizer (II), are exposed to high temperatures, with the result that the crosslinking bonds come off, however, when there is a compound having a pair of isolated electrons that can be coordinate-bonded to a metal atom, the dissociation of crosslinking bonds can be prevented although the reason for this has not been clarified. This hardness-reduction preventive mechanism is exerted not only on a gel-state resin containing a thermal conductive filler such as a thermal conductive sheet, but also on a gel-state resin containing no thermal conductive filler or the like, in the same manner. Consequently, in the case when such a polyurethane-based gel-state resin is applied to the field that is subjected to high temperature, it is preferable to carry out a urethane-forming reaction in the presence of an organic metal compound and a compound having an atom with a pair of isolated electrons in its molecule, in order to improve the heat resistance.

With respect to the compound having an atom with a pair of isolated electrons in its molecule, a compound having a nitrogen atom or an oxygen atom with a pair of isolated electrons in its molecule is preferably used, and in particular, a compound having two or more atoms, each having a pair of isolated electrons, in its molecule is more preferably used. Specific examples thereof include: tertiary amine compounds, such as N,N,N',N'-tetramethyl-1,6-hexane diamine, N,N,N'-triethylaminoethyl methanol amine, N,N,N'-trimethylaminoethyl ethanol amine and hexamethylphosphor amide, and ketone compounds, such as acetyl acetone. Two or more kinds of these may be used in combination.

The amount of use of the organic metal compound serving as a crosslinking accelerator is preferably set in a range of 0.001 to 3 parts by mass with respect to 100 parts by mass of the crosslinking polymer (I-b), and the ratio (mass ratio) between the organic metal compound and the compound having an atom with a pair of isolated electrons in its molecule is preferably set in a range of 1/1 to 1/100.

The resin compound containing the crosslinking polymer (I-b) may contain an acidic compound. This acidic compound, for example, allows the thermal conductive filler and the like to be quickly dispersed uniformly so that it functions to improve the productivity. Moreover, it also makes the viscosity of the resin composition lower so that a large amount of the thermal conductive filler and the like can be blended, making it possible to improve the heat-radiating (thermal conductive) performance of the resulting cured product. Moreover, it also becomes possible to easily remove air that is contained upon manufacturing the resin composition. In this manner, the acidic compound allows the thermal conductive filler that is essential as the thermal conductive material to exert its effects to the maximum level.

With respect to the acidic compound, not particularly limited, any compound may be used as long as it exerts acidity of 1.0 or more in PKa (acid dissociation constant) defined in Chemistry Handbook Basics II (edited by the Chemical Society of Japan, published by Maruzen Co., Ltd.), and in order to fully exert the effects of the present invention, an organic acidic compound is preferably used, and carboxylic acid is more preferably used. Moreover, in order to prevent corrosion on electric and electronic parts and the like caused by the acidic compound in the cured product of the resin composition, the acidic compound should be evaporated from the cured product after the cured product has been obtained; therefore, carboxylic acid which has a boiling point of 250° C. or less under normal pressure is preferably used. Carboxylic acids of this type corresponds to carboxylic acids having carbon atoms the total number of which is from 1 to 8. Moreover, this includes substituted forms, and one kind thereof may be used, or two or more kinds of these may be used in combination.

With respect to carboxylic acid having a boiling point of 250° C. or less and carbon atoms the total number of which is in a range from 1 to 8, examples thereof include formic acid, acetic acid, propionic acid, butanoic acid, valeric acid, hexanoic acid and 2-ethylhexanoic acid. When the curing temperature is 130° C. or less, it is preferable to use carboxylic acid in which the boiling temperature under normal pressure of the acidic substance to be used is 170° C. or less.

In the resin composition, the acidic compound is preferably contained at 0.005 parts by mass or more (more preferably, 0.01 parts by mass or more, most preferably, 0.03 parts by mass or more) with respect to 100 parts by mass of the crosslinking polymer (I-b). Here, the upper limit value is preferably set to about 5 parts by mass, more preferably, to about 3 parts by mass, most preferably, to about 2 parts by mass. By setting the lower limit value and the upper limit value to the above-mentioned values, the blending effects of the acidic compound are appropriately exerted.

In the case of the resin composition in which the polymer (I) corresponds to the crosslinking polymer (I-b), supposing that the total amount of the two components is 100% by mass, the ratio between the liquid-state plasticizer (II) and the crosslinking polymer (I-b) is preferably set so that the liquid-state plasticizer (II) is in a range from 50 to 90% by mass (more preferably, from 50 to 80% by mass, most preferably, from 55 to 80% by mass), while the crosslinking polymer (I-b) is in a range from 10 to 50% by mass (more preferably, from 20 to 50% by mass, most preferably, from 20 to 45% by mass).

When the liquid-state plasticizer (II) exceeds 90% by mass, that is, when the crosslinking polymer (I-b) is less than 10% by mass, the liquid-state plasticizer is not held in the cured product sufficiently to fail to form a gel state in some cases. Consequently, stickiness tends to occur on the resulting cured product which has been obtained by extruding the resin composition into a sheet form after kneading with the thermal conductive filler, degradation tends to occur in the surface smoothness of the sheet and a separation between the resin and the thermal conductive filler tends to occur, failing to provide a preferable process. In contrast, when the crosslinking polymer (I-b) exceeds 50% by mass, that is, when the liquid-state plasticizer (II) is less than 50% by mass, the viscosity of the resin composition becomes higher to sometimes cause deterioration in the operability and the like and a reduction in the flexibility of the resulting cured product.

The resin composition of the present invention contains a thermal conductive filler (III) having a thermal conductivity of 20 W/m·K or more as an essential component. Specific examples thereof include inorganic fillers (oxides such as aluminum oxide, magnesium oxide, zinc oxide and silicon oxide; hydroxides such as aluminum hydroxide and magnesium hydroxide; carbides such as silicon carbide; and nitrides such as aluminum nitride, boron nitride and silicon nitride, etc.), metal-based fillers [silver, copper, aluminum, iron, zinc, nickel, tin and alloys of these (for example, copper-tin alloy, etc.)], and carbon-based fillers (carbon, graphite, etc.). In the applications that require a high-level electrical insulating property, inorganic fillers are preferably used. When used, two or more kinds of these may be used in combination. The thermal conductivity of the thermal conductive filler to be used can be measured on its sintered product by using a thermal conductivity measuring device using a hot disk method: Item No. TPA-501, made by Kyoto Electronics Manufacturing Co., Ltd.

The thermal conductive filler (III) of this type having a thermal conductivity of 20 W/m·K or more is preferably contained in a range of 100 to 1500 parts by mass, more preferably, 200 to 1300 parts by mass, with respect to 100 parts by mass of the polymer (I). As the amount of charge of the thermal conductive filler to the polymer (I) increases, the thermal conductivity of the resulting cured product (thermal conductive material) becomes higher, making it possible to improve the heat-radiating performance. In contrast, since the resulting cured product tends to have deterioration in the flexibility, the amount of charge is preferably adjusted by taking a required thermal conductivity and the flexibility of the cured product into consideration. The thermal conductive filler (III) may be subjected to a surface treatment, such as a silane treatment, if necessary, in order to enhance the dispersibility in the composition and increase the amount of charge. Moreover, with respect to the shape of the thermal conductive filler (III), not particularly limited, examples thereof include a spherical shape, a fiber shape, a scale shape, a flat shape, a fragmental shape and an amorphous shape.

In the resin composition of the present invention, in order to improve the strength and handling property of the resulting cured product, the surface of the molded product of the resin composition may be impregnated or adhered with a resin, inorganic fibers or organic fibers. Moreover, with respect to the resin composition of the present invention, any of conventionally known materials in the molding material field and the like such as reinforced fibers, an inorganic or organic filler, a polymerization initiator, a polymerization inhibitor, a low contraction agent, a releasing agent, a thickener, an antifoamer, a thixotropic agent, a ultraviolet-ray absorbing agent, a ultraviolet-ray stabilizer, an antioxidant, a flame retarder, a coupling agent, pigments, dyes, a magnetic material, an antistatic agent, an electromagnetic wave absorbing agent, paste-state oil, paraffin wax, microcrystalline wax, higher fatty oil and a thermo-softener, may be applicable, unless the objectives of the present invention are intervened.

The degree of additions of these is preferably determined to an amount that would not impair the objectives of the present invention, and specifically, the amount is preferable set to 1000 parts by mass or less as the total amount of the additives, with respect to 100 parts by mass of the polymer (I). The upper limit of the amount of addition is preferably set to 900 parts by mass, more preferably, to 800 parts by mass.

The resin composition of the present invention, which is in a liquid state at normal temperature, can be obtained by using a conventionally known kneader. Although not particularly limited, examples thereof include continuous kneaders, such as a mixer, a roll mill, a Van Bally mixer, a kneader, a pressurized kneader and a twin-screw kneader. Moreover, the kneading process may be carried out, while the inner pressure of the device is being decompressed to remove air contained in the composition, or a heating process and/or a pressurizing process are being carried out, if necessary. When the kneading process, the succeeding molding process and the like are taken into consideration, it is preferable to adjust the viscosity of the resin composition prior to the addition of the thermal conductive filler (III) to 5000 mPa·s or less (more preferably, 3000 mPa·s or less, still more preferably, 2200 mPa·s or less) at 25° C.

Here, in order to prevent curing of the resin composition of the present invention during storage, it is preferable to store the constituent components of the resin composition separately. When the polymer (I) corresponds to the (meth)acrylic polymer (I-a), for example, the constituent components are preferably separated into a first material that contains the (meth)acrylic polymer (I-a) and the polymerizable monomer (IV), without containing the radical polymerization initiator (V), and a second material that contains the radical polymerization initiator (V), without containing the polymerizable monomer (IV). The liquid-state plasticizer (II) is preferably put into the first material or the second material, or both of these materials with the liquid-state plasticizer divided in an appropriate ratio. In contrast, when the polymer (I) corresponds to the crosslinking polymer (I-b), the crosslinking polymer (I-b) and the crosslinking agent (VI) are preferably stored separatly. Therefore, for example, a mixture of the liquid-state plasticizer (II) and the crosslinking polymer (I-b) is preferably prepared as a first material, and the crosslinking agent (VI) is preferably prepared as a second material. Preferably, the crosslinking accelerator, the compound having an atom with a pair of isolated electrons in its molecule, the acidic compound and the like are preliminarily blended into either the first material or the second material, or both of the materials. In any of the above-mentioned cases, since the viscosity of the mixture becomes higher when the thermal conductive filler (III) is kneaded, the thermal conductive filler (III) is preferably kneaded prior to the molding process, from the view point of operability.

The resin composition of the present invention is cured so that the thermal conductive material can be obtained. In the case when the polymer (I) corresponds to the (meth)acrylic polymer (I-a), the resin composition is cured by a polymerization reaction of the polymerizable monomer (IV) in the composition, and in the case when the polymer (I) corresponds to the crosslinking polymer (I-b), the resin composition is cured by a crosslinking reaction with the crosslinking agent (VI) to form a thermal conductive material. Moreover, since the liquid-state plasticizer (II) is held in three-dimensional network of high molecular chains, it is possible to obtain a gel-state cured product that is flexible and superior in heat resistance, and consequently to provide a superior thermal conductivity. With respect to the heating temperature at the time of curing, in the case of the polymerization reaction, although not particularly limited, it is set to a temperature higher than a 10-hour half-life period temperature of the radical polymerization initiator (V) by 10 to 50° C., and in the case of the crosslinking reaction, a temperature that is suitable for the crosslinking agent is selected so that it becomes possible to increase the curing rate, and consequently to improve the productivity.

The resin composition of the present invention may be formed into a desired shape, and the shape and the molding method are not particularly limited. For example, the resin composition may be charged into an injection molding mold or a batch-type mold so as to be molded into a desired shape, or may be formed into a sheet shape by using an extruder or a method such as casting. The sheet-shaped product is effectively used as a thermal conductive sheet.

Moreover, the molding process may be carried out while conducting a heating process in order to simultaneously mold the resin composition into a thermal conductive material having a desired shape, while accelerating the polymerization reaction and crosslinking reaction. Furthermore, the resin composition may be once molded into a desired shape, and then heated or aged (maintained at room temperature for a long time) so that the liquid-state plasticizer (II) is spread over the inside of the crosslinking polymer to form a gel-state resin.

The thermal conductive material of the present invention may be obtained by allowing the polymerizable monomer (IV) containing a polyfunctional monomer in a range of 0.01 to 5% by mass to undergo a polymerization process in the presence of the liquid-state plasticizer (II) and the thermal conductive filler (III), without using the polymer (I).

The thermal conductive material, obtained by curing the resin composition of the present invention, is preferably designed to have hardness in a range of 5 to 60. This hardness is defined as a value measured at 25° C. by using an Asker rubber C-type hardness tester, made by Koubunshi Keiki Co., Ltd. Here, in the case when a cured product, obtained without adding the thermal conductive filler to the resin composition, is set to hardness in a range of 5 to 80, it becomes possible to obtain a thermal conductive material that is set in the above-mentioned hardness range. Here, this hardness is defined as a value measured at 25° C. by using an Asker rubber F-type hardness tester, made by Koubunshi Keiki Co., Ltd. With respect to the hardness, a pressing stylus of the hardness tester is pushed into the center of a disc shaped sample having a thickness of 15 mm and a diameter in a range from 5 to 8 cm; thus, the pressing face is made in close-contact with the sample so that the maximum indicated value within a second from the time of the close-contact is used as the hardness.

Preferably, the thermal conductive material of the present invention is capable of exerting flexibility stably for a long time. The determination as to whether or not the long-term flexibility has been achieved is made by checking for whether or not the liquid-state plasticizer (II) has been evaporated; therefore, the mass loss rate (%), obtained when the thermal conductive material has been maintained in an oven heated to 130° C. (or alternatively to 100° C.) for 168 hours, can be used as its guideline, and the mass loss rate is preferably set to 5% or less, more preferably, to 3% or less, still more preferably, to 2% or less.

EXAMPLES

The following description will discuss the present invention in detail by means of examples; however, the present invention is not intended to be limited by these examples, and it will be obvious that the same may be varied in many ways. All such variations and modifications are not to be regarded as a departure from the technical scope of the invention. In the Examples and Comparative Examples, "parts" refers to "parts by mass" and "%" refers to "% by mass", unless otherwise indicated.

Experiment 1 (Experiments Relating to a Resin Composition in which Polymer (I) is a (meth)acrylic Polymer (I-a))

Synthesis Example 1

Into a container equipped with a thermometer, a stirring device, a gas introducing pipe, a reflux condenser and a dropping funnel were charged 40 parts of 2-ethylhexyl acrylate (2EHA), 50 parts of toluene and 0.3 parts of α-methylstyrene serving as a chain transfer agent, and the inner gas of the container was replaced with a nitrogen gas. This was heated to 80° C., and a mixture of 0.05 parts of azoisobutyronitrile serving as a polymerization initiator and 10 parts of toluene was charged into the dropping funnel, and dropped into the container in two hours. To this was further added 0.01 parts of azoisobutyronitrile, and the resulting mixture was heated to 90° C. and allowed to undergo a polymerization reaction for 3 hours. Prior to the completion of the polymerization reaction, air was blown thereto to cool the system so that the polymerization was completed; thus, a mixture of poly-2-ethylhexyl acrylate (PEHA) and toluene was obtained. Next, the pressure of the system was reduced to distill off toluene so that PEHA was obtained. With respect to the molecular weight of this PEHA measured by GPC (Gel Permeation Chromatography), the weight-average molecular weight Mw was 106,000 and the number-average molecular weight Mn was 51,000. Moreover, the glass transition point temperature, measured by a differential scanning calorimeter according to a conventional method, was −60° C.

Synthesis Example 2

Into a container equipped with a thermometer, a stirring device, a gas introducing pipe, and a reflux condenser was charged 100 parts of lauryl methacrylate (LMA), and the inner gas of the container was replaced with a nitrogen gas. This was heated to 80° C., and a mixture of 0.02 parts of mercaptopropionic acid as a chain transfer agent and 0.01 parts of azoisobutyronitrile serving as a polymerization initiator were added thereto, and the resulting mixture was allowed to undergo a bulk polymerization reaction for 3.0 hours under nitrogen atmosphere. Prior to the completion of the polymerization reaction, simultaneously as air was blown thereto, 0.1 parts of a polymerization inhibitor, that is, hydroquinone, was added thereto, and the system was then cooled to terminate the polymerization reaction in the middle of the process. In the resulting mixture, polylauryl methacrylate (PLMA) was 50.0%, and LMA, which was a polymerizable monomer (IV) component, was 50.0%. The viscosity of the resulting PLMA at 25° C. was 4980 mPa·s. With respect to the molecular weight of this PLMA measured by GPC, the weight-average molecular weight Mw was 136,000 and the number-average molecular weight Mn was 58,000. Moreover, the glass transition point temperature, measured by a differential scanning calorimeter according to a conventional method, was −65° C.

No.1-1

To a mixture (100 parts) composed of 30 parts of PEHA, 39 parts of LMA serving as a monomer, 1 part of polyethylene glycol dimethacrylate (made by Kyoei Chemical Co., Ltd. tradename: "Light Ester 9EG") serving as a polyfunctional monomer, 30 parts of trimellitic acid ester-based liquid-state plasticizer (made by Asahi Denka Co., Ltd., tradename: "ADK-Cizer C880") (hereinafter, this mixture prior to adding a polymerization initiator thereto, is sometimes referred to as "liquid-state resin") was added 1 part of 1,1,3,3-tetramethyl-butylperoxy 2-ethyl hexanoate (made by Kayaku Akzo Corporation: tradename: "Kayaester TMPO-70") serving as a thermal polymerization initiator, and the resulting mixture that had been defoamed was poured into a glass cell having a PET film with a thickness of 15 mm, which has been subjected to a releasing treatment, and this was allowed to undergo a polymerization reaction in an oven at 80° C. for one hour and, further, at 100° C. for one hour so that a plate-shaped cured product was obtained. The resulting cured product was subjected to hardness-measurement under the following criteria, and the results are shown in Table 2. Here, when 3 g of the liquid-state plasticizer (the above-mentioned "ADK-Cizer C880") was put into a watch glass having 5 cm in diameter, made of aluminum, and held in an oven heated to 130° C. for 24 hours, the mass loss rate thereof was 0.07%. Moreover, the viscosity thereof at 25° C. was 100 mPa·s and the solidifying point thereof was −21° C.

Next, 100 parts of the liquid-state resin, 1 part of the above-mentioned "Kayaster TMPO-70" serving as a thermal polymerization initiator, 0.1 parts of an antifoamer (made by BYK-Chemie Japan KK: tradename "A-515") and 400 parts of aluminum oxide having a thermal conductivity of 30 W/m·K (made by Showa Denko K.K.: item number AS-10) were uniformly kneaded to prepare a resin composition for a thermal conductive material. Thereafter, the resin composition was subjected to a defoaming process, and poured into a glass cell having a PET film with a thickness of 1 mm, which had been subjected to a releasing treatment, and further polymerized in an oven at 80° C. for one hour, and then at 100° C. for one hour to be cured. The resulting sheet-shaped cured product was evaluated based upon the following criteria, and the results are shown in Table 2.

[Hardness of the Plate-shaped Cured Product]

As described above, to 100 parts of the liquid-state resin was added 1 part of the above-mentioned "Kayaster TMPO-70" serving as a thermal polymerization initiator, and the resulting mixture that had been defoamed was poured into a container with a thickness of 15 mm, and the mixture was heated in an oven at 80° C. for one hour and, further, at 100° C. for one hour so that the mixture was cured. An Asker rubber F-type hardness tester, made by Koubunshi Keiki Co., Ltd., was put in the center of the measuring sample, with a pressing stylus of the hardness tester being pushed into the center of the sample cut into a disc-shape with a thickness of 15 mm and a diameter in a range of 5 to 8 cm; thus, the pressing face was made in close-contact with the sample so that the maximum indicated value within a second from the time of the close-contact was used as the hardness. The measurements were carried out at 25° C.

[Moldability of Sheet]

The sheet-shaped cured product obtained as described above was visually observed, and evaluated based upon the following criteria.
○: Neither irregularities nor bubbles were found on the sheet surface, and the surface was uniform without a separation between the resin and the inorganic filler so that a desired surface property was obtained.
X: Irregularities and bubbles were found on the sheet surface. A separation occurred between the resin and the inorganic filler, with the result that an uneven sheet was produced.

[Initial Thermal Conductivity of Sheet]

The thermal conductivity of the sheet was measured by using a Quick Thermal Conductivity Meter, Model QTM-500, available from Kyoto Electronics Manufacturing Co., Ltd. With respect to the measuring sample, a sheet-shaped cured product, laminated to a thickness of 10 mm, was used. The measurements were carried out at 25° C.

[Initial Hardness of Sheet]

The initial hardness of the sheet was measured by using an Asker rubber C-type hardness tester made by Koubunshi Keiki Co., Ltd., in compliance with JIS K7312. With respect to the measuring sample, a sheet-shaped cured product, laminated to a thickness of 10 mm, was used, and in the same manner as the use of F-type hardness tester, the measurements were carried out at 25° C. The smaller the resulting numeric value, the more flexible the sheet becomes.

[Heat Resistant Property]

After the sheet-shaped cured product had been maintained in an oven set to 130° C. for 168 hours, the mass loss rate, the hardness and the thermal conductivity thereof were measured. The Mass loss rate was found by using an expression: (Weight before the measurement−Weight after the measurement)/Weight before the measurement×100=Mass loss rate (%). The hardness and the thermal conductivity were measured in the same manner as the initial hardness and the initial thermal conductivity. The smaller the difference in hardness before the heat resistant test (initial hardness of the sheet) and after the heat resistant test, the longer the flexibility is maintained.

[Durability]

The hardness difference (Δhardness) between the sheet initial hardness and the sheet hardness after the heat-resistant test was determined. As this value becomes smaller, the flexibility of the sheet can be maintained for a longer period; therefore, for example, when the sheet is interposed between a heat generating body and a heat conductive body, the contact area between these bodies is maintained for a long period of time so that the thermal conductivity from the heat generating body to the heat conductive body is not lowered to prepare a stable thermal conductive property for a long period of time.

No. 1-2

The same processes as those of No. 1-1 were carried out except that the liquid-state resin, which was composed of 30 parts of PEHA, 59 parts of LMA serving as a monomer, 1 part of polyethylene glycol dimethacrylate (the aforementioned "Light Ester 9EG") serving as a polyfunctional monomer and 10 parts of trimellitic acid ester-based liquid-state plasticizer (the aforementioned "ADK-Cizer C880"), was used so that a plate-shaped cured product, a resin composition for a thermal conductive material and a sheet-shaped cured product thereof were obtained. These were evaluated in the same manner as No. 1-1, and the results are shown in Table 2.

No. 1-3

The same processes as those of No. 1-1 were carried out except that the liquid-state resin, which was composed of 30 parts of PEHA, 64 parts of LMA serving as a monomer, 1 part of polyethylene glycol dimethacrylate (the aforementioned "Light Ester 9EG") serving as a polyfunctional monomer and 5 parts of trimellitic acid ester-based liquid-state plasticizer (the aforementioned "ADK-Cizer C880"), was used so that a plate-shaped cured product, a resin composition for a thermal conductive material and a sheet-shaped cured product thereof were obtained. These were evaluated in the same manner as No. 1-1, and the results are shown in Table 2.

No. 1-4

The same processes as those of No. 1-1 were carried out except that the liquid-state resin, which was composed of 30 parts of PEHA, 29 parts of LMA serving as a monomer, 1 part of polyethylene glycol dimethacrylate (the aforementioned "Light Ester 9EG") serving as a polyfunctional monomer and 40 parts of trimellitic acid ester-based liquid-state plasticizer (the aforementioned "ADK-Cizer C880"), was used so that a plate-shaped cured product, a resin composition for a thermal conductive material and a sheet-shaped cured product thereof were obtained. These were evaluated in the same manner as No. 1-1, and the results are shown in Table 2.

No. 1-5

The same processes as those of No. 1-1 were carried out except that the liquid-state resin, which was composed of 15 parts of PEHA, 34 parts of LMA serving as a monomer, 1 part of polyethylene glycol dimethacrylate (the aforementioned "Light Ester 9EG") serving as a polyfunctional monomer and 50 parts of trimellitic acid ester-based liquid-state plasticizer (the aforementioned "ADK-Cizer C880"), was used so that a plate-shaped cured product, a resin composition for a thermal conductive material and a sheet-shaped cured product thereof were obtained. These were evaluated in the same manner as No. 1-1, and the results are shown in Table 2.

No. 1-6

The same processes as those of No. 1-1 were carried out except that a liquid-state resin, which was composed of 40 parts of PEHA, 29 parts of LMA serving as a monomer, 1 part of polyethylene glycol dimethacrylate (the aforementioned "Light Ester 9EG") serving as a polyfunctional monomer and 30 parts of trime llitic acid ester-based liquid-state plasticizer (the aforementioned "ADK-Cizer C880"), was used so that a plate-shaped cured product, a resin composition for a thermal conductive material and a sheet-shaped cured product thereof were obtained. These were evaluated in the same manner as in No. 1-1, and the results are shown in Table 2.

No. 1-7

The same processes as those of No. 1-1 were carried out except that a liquid-state resin, which was composed of 30 parts of PEHA, 39 parts of 2-ethylexyl acrylate, 1 part of polyethylene glycol dimethacrylate (the aforementioned "Light Ester 9EG") serving as a polyfunctional monomer and 30 parts of trimellitic acid ester-based liquid-state plasticizer (the aforementioned "ADK-Cizer C880"), was used so that a plate-shaped cured product, a resin composition for a thermal conductive material and a sheet-shaped cured product thereof were obtained. These were evaluated in the same manner as in No. 1-1, and the results are shown in Table 2.

No. 1-8

The same processes as those of No. 1-1 were carried out except that a liquid-state resin, which was composed of 30 parts of PEHA, 39 parts of n-butyl acrylate, 1 part of polyethylene glycol dimethacrylate (the aforementioned "Light Ester 9EG") serving as a polyfunctional monomer and 30 parts of trimellitic acid ester-based liquid-state plasticizer (the aforementioned "ADK-Cizer C880"), was used so that a plate-shaped cured product, a resin composition for a thermal conductive material and a sheet-shaped cured product thereof were obtained. These were evaluated in the same manner as in No. 1-1, and the results are shown in Table 2.

No. 1-9

The same processes as those of No. 1-1 were carried out except that a liquid-state resin, which was composed of 30 parts of PEHA, 39 parts of 2EHA serving as a monomer, 1 part of polyethylene glycol dimethacrylate (the above-mentioned "Light Ester 9EG") serving as a polyfunctional monomer, 30 parts of trimellitic acid ester-based liquid-state plasticizer (made by Asahi Denka Co., Ltd., tradename: "ADK-Cizer C79"), was used so that a plate-shaped cured product, a resin composition for a thermal conductive material and a sheet-shaped cured product thereof were obtained. These were evaluated in the same manner as in No. 1-1, and the results are shown in Table 2. Moreover, when 3 g of the applied liquid-state plasticizer (made by Asahi Denka Co., Ltd., tradename: "ADK-Cizer C79") was put on a watch glass having 5 cm in diameter, made of aluminum, and held in an oven heated to 130° C. for 24 hours, the mass loss rate thereof was 0.09%. Moreover, the viscosity thereof at 25° C. was 100 mPa·s and the solidifying point thereof was −22° C.

No. 1-10

The same processes as those of No. 1-1 were carried out except that a liquid-state resin, which was composed of 70 parts of the mixture obtained in Synthesis Example 2, that is, 35 parts of PLMA and 35 parts of LMA serving as a monomer, as well as 1 part of polyethylene glycol dimethacrylate (the aforementioned "Light Ester 9EG") serving as a polyfunctional monomer and 29 parts of trimellitic acid ester-based liquid-state plasticizer (the aforementioned "ADK-Cizer C880"), was used so that a plate-shaped cured product, a resin composition for a thermal conductive material and a sheet-shaped cured product thereof were obtained. These were evaluated in the same manner as in No. 1-1, and the results are shown in Table 2.

No. 1-11

The same processes as those of No. 1-1 were carried out except that a liquid-state resin, which was composed of 70 parts of the mixture obtained in Synthesis Example 2, that is, 35 parts of PLMA and 35 parts of LMA serving as a monomer, as well as 1 part of polyethylene glycol dimethacrylate (the aforementioned "Light Ester 9EG") serving as a polyfunctional monomer and 29 parts of trimellitic acid ester-based liquid-state plasticizer (the aforementioned "ADK-Cizer C79"), was used so that a plate-shaped cured product, a resin composition for a thermal conductive material and a sheet-shaped cured product thereof were obtained. These were evaluated in the same manner as in No. 1-1, and the results are shown in Table 2.

No. 1-12

The same processes as those of No. 1-1 were carried out except that a liquid-state resin, which was composed of 30 parts of PEHA, 39 parts of 2EHA serving as a monomer, 1 part of polyethylene glycol dimethacrylate (the above-mentioned "Light Ester 9EG") serving as a polyfunctional monomer, 30 parts of phosphoric acid ester-based liquid-state plasticizer (made by Ajinomoto-Fine-Techno Co., Inc., tradename: "Kronitex TXP"), was used so that a plate-shaped cured product, a resin composition for a thermal conductive material and a sheet-shaped cured product thereof were obtained. These were evaluated in the same manner as in No. 1-1, and the results are shown in Table 2. Moreover, when 3 g of the applied liquid-state plasticizer (made by Ajinomoto-Fine-Techno Co., Inc., tradename: "Kronitex TXP") was put on a watch glass having 5 cm in diameter, made of aluminum, and held in an oven heated to 130° C. for 24 hours, the mass loss rate thereof was 0.20%. Moreover, the viscosity thereof at 25° C. was 175 mPa·s and the solidifying point thereof was −15° C.

No. 1-13 (for use in Comparison)

The same processes as those of No. 1-1 were carried out except that a liquid-state resin, which was composed of 69 parts of 2EHA serving as a monomer, 1 part of polyethylene glycol dimethacrylate (the aforementioned "Light Ester 9EG") serving as a polyfunctional monomer and 30 parts of trimellitic acid ester-based liquid-state plasticizer (the aforementioned "ADK-Cizer C880"), was used (that is, no (meth) acrylic polymer that formed an essential component was contained) so that a plate-shaped cured product, a resin composition for a thermal conductive material and a sheet-shaped cured product thereof were obtained. These were evaluated in the same manner as in No. 1-1, and the results are shown in Table 2. The resulting sheet-shaped cured product had a separation between the resin and the aluminum oxide serving as a filler, resulting in an uneven sheet. For this reason, the succeeding evaluations were not carried out.

No. 1-14 (for use in Comparison)

The same processes as those of No. 1-1 were carried out except that a liquid-state resin, which was composed of 99 parts of 2EHA serving as a monomer and 1 part of polyethylene glycol dimethacrylate (the aforementioned "Light Ester 9EG") serving as a polyfunctional monomer, was used (that is, neither (meth)acrylic polymer nor liquid-state plasticizer that formed essential components was contained) so that a plate-shaped cured product, a resin composition for a thermal conductive material and a sheet-shaped cured product thereof were obtained. These were evaluated in the same manner as in No. 1-1, and the results are shown in Table 2. The resulting plate-shaped cured product had a hardness value of 78, which was greater than any of the plate-shaped cured products obtained in Examples in the present invention. The resulting sheet had a separation between the resin and the aluminum oxide serving as a filler, resulting in an uneven sheet. For this reason, the succeeding evaluations were not carried out.

No. 1-15 (for use in Comparison)

The same processes as those of No. 1-1 were carried out except that a liquid-state resin, which was composed of 30 parts of PEHA, 69 parts of 2EHA serving as a monomer and 1 part of polyethylene glycol dimethacrylate (the aforementioned "Light Ester 9EG") serving as a polyfunctional monomer, was used (that is, no liquid-state plasticizer that formed an essential component was contained) so that a plate-shaped cured product, a resin composition for a thermal conductive material and a sheet-shaped cured product thereof were obtained. These were evaluated in the same manner as in No. 1-1, and the results are shown in Table 2. The resulting plate-shaped cured product had a hardness value of 71 and the resulting sheet had a hardness value of 80 in its initial hardness, and both of these values were greater than those of the cured products obtained in Examples in the present invention. Consequently, in the case when the cured product is interposed between a heat-generating body, such as a PDP, an electric/electronic part, and a thermal conductive body, such as a heat sink, a thermal conductive fin and a metal plate, so that the heat generated from the PDP, the electric/electronic part and the like is conducted, the contact area with these members tends to become smaller, resulting in degradation in the thermal conductivity. Moreover, the sheet hardness after the heat resistance test was 98, and the hardness difference before and after the tests was greater than any of those differences obtained in Examples of the present invention. For this reason, it is clear that this sheet fails to provide a long-term flexibility, resulting in a failure to provide a stable thermal conductive property.

Here, the meanings of abbreviations used in Table 2 are explained as follows:

PEHA: Poly-2-ethylhexyl acrylate obtained in Synthesis Example 1

PLMA: Polylauryl methacrylate obtained in Synthesis Example 2

2EHA: 2-ethylhexyl acrylate

LMA: Lauryl methacrylate

BA: n-Butyl acrylate

9EG: Polyethylene glycol dimethacrylate made by Kyoei Chemical Co., tradename: "Light Ester 9EG"

C880: Liquid-state plasticizer made by Asahi Denka Co., Ltd., tradename: "ADK-Cizer C880"

C79: Liquid-state plasticizer made by Asahi Denka Co., Ltd., tradename: "ADK-Cizer C79"

TMPO70: Polymerization initiator made by Kayaku Akzo Corporation, tradename: "Kayaester TMPO-70"

A-515: Antifoamer made by BYK-Chemie Japan KK, tradename: "A-515"

Δhardness: Hardness difference between a sheet initial hardness value and the sheet hardness value after the heat-resistant test

TABLE 2

(Experiment 1)

| | | | No. | | | | | | | | | | | | | | |
|---|---|---|---|---|---|---|---|---|---|---|---|---|---|---|---|---|---|
| | | | 1-1 | 1-2 | 1-3 | 1-4 | 1-5 | 1-6 | 1-7 | 1-8 | 1-9 | 1-10 | 1-11 | 1-12 | 1-13 | 1-14 | 1-15 |
| Components of resin composition | Components of liquid-state resin | PEHA | 30 | 30 | 30 | 30 | 15 | 40 | 30 | 30 | 30 | 0 | 0 | 30 | 0 | 0 | 30 |
| | | PLMA | 0 | 0 | 0 | 0 | 0 | 0 | 0 | 0 | 0 | 35 | 35 | 0 | 0 | 0 | 0 |
| | | 2EHA | 0 | 0 | 0 | 0 | 0 | 0 | 39 | 0 | 39 | 0 | 0 | 0 | 69 | 99 | 69 |
| | | LMA | 39 | 59 | 64 | 29 | 34 | 29 | 0 | 0 | 0 | 35 | 35 | 39 | 0 | 0 | 0 |
| | | BA | 0 | 0 | 0 | 0 | 0 | 0 | 0 | 39 | 0 | 0 | 0 | 0 | 0 | 0 | 0 |
| | | 9EG | 1 | 1 | 1 | 1 | 1 | 1 | 1 | 1 | 1 | 1 | 1 | 1 | 1 | 1 | 1 |
| | | C880 | 30 | 10 | 5 | 40 | 50 | 30 | 30 | 30 | 0 | 29 | 0 | 29 | 30 | 0 | 0 |
| | | C79 | 0 | 0 | 0 | 0 | 0 | 0 | 0 | 0 | 30 | 0 | 29 | 0 | 0 | 0 | 0 |
| | | Kronitex TXP | 0 | 0 | 0 | 0 | 0 | 0 | 0 | 0 | 0 | 0 | 0 | 30 | 0 | 0 | 0 |
| | | TMPO70 | 1 | 1 | 1 | 1 | 1 | 1 | 1 | 1 | 1 | 1 | 1 | 1 | 1 | 1 | 1 |
| | | A-515 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 |
| | | Aluminum oxide (AS-10) | 400 | 400 | 400 | 400 | 400 | 400 | 400 | 400 | 400 | 400 | 400 | 400 | 400 | 400 | 400 |

TABLE 2-continued (Experiment 1)

| | | No. | | | | | | | | | | | | | | |
|---|---|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 | 1-14 | 1-15 |
| Plate-shaped hardness (F type) | | 12 | 40 | 58 | 7 | 5 | 14 | 13 | 13 | 12 | 11 | 10 | 15 | 18 | 78 | 71 |
| Sheet moldability | | ○ | ○ | ○ | ○ | ○ | ○ | ○ | ○ | ○ | ○ | ○ | ○ | x | x | ○ |
| Sheet initial hardness (C-type) | | 40 | 55 | 60 | 31 | 23 | 43 | 45 | 50 | 41 | 40 | 42 | 39 | — | — | 80 |
| Sheet initial thermal conductivity (W/m · K) | | 1.5 | 1.6 | 1.4 | 1.5 | 1.5 | 1.4 | 1.6 | 1.6 | 1.6 | 1.6 | 1.5 | 1.5 | — | — | 1.4 |
| Heat resistance | Mass loss rate (%) | 0.3 | 0.4 | 0.4 | 0.4 | 0.3 | 0.3 | 0.3 | 0.4 | 0.6 | 0.4 | 0.6 | 0.9 | — | — | 0.3 |
| | Sheet hardness (C-type) | 43 | 58 | 65 | 33 | 24 | 46 | 49 | 53 | 47 | 43 | 48 | 48 | — | — | 98 |
| | Thermal conductivity (W/m · K) | 1.5 | 1.6 | 1.5 | 1.5 | 1.5 | 1.4 | 1.6 | 1.7 | 1.7 | 1.7 | 1.6 | 1.7 | — | — | 1.5 |
| Durability (Δ hardness) | | 3 | 3 | 5 | 2 | 1 | 3 | 4 | 3 | 6 | 3 | 6 | 9 | — | — | 18 |

No. 1-16

A liquid-state resin, composed of the mixture obtained in Synthesis Example 2 (70 parts), that is, 35 parts of PLMA and 35 parts of LMA serving as a monomer, as well as 1 part of polyethylene glycol dimethacrylate (the aforementioned "Light Ester 9EG") serving as a polyfunctional monomer, 30 parts of phthalic acid ester-based liquid-state plasticizer (made by Kao Corporation, tradename: "Vinycizer 124"), 2 parts of t-amylperoxy 3,5,5-trimethyl hexanoate serving as a thermal polymerization initiator with a 10-hour half-life period temperature of 95° C. (made by Kayaku Akzo Corporation: tradename: "Kayaester AN"), and 1300 parts of aluminum oxide having a thermal conductivity of 30 W/m·K (made by Showa Denko K.K.: item number AS-40) were kneaded by using a pressurized kneader. Moreover, when 3 g of the applied liquid-state plasticizer (the above-mentioned "Vinycizer-124") was put on a watch glass having 5 cm in diameter, made of aluminum, and held in an oven heated to 130° C. for 24 hours, the mass loss rate thereof was 0.43%. Moreover, the viscosity thereof at 25° C. was 65 mPa·s and the solidifying point thereof was −22° C.

Thereafter, the resulting kneaded matter was extruded into a gap between two PET films by using an extruder with a thickness set to 1 mm so that a sheet-shaped product was obtained. The resulting sheet was uniform, and free from a separation between the resin and the inorganic filler. Moreover, neither bubbles nor irregularities were observed on the surface. Consequently, it had a superior pre-forming property.

Next, spacers, which were made of silicon and had a thickness of 1 mm, were attached onto the periphery of the resulting sheet-shaped product, and the sheet was put on a flat-plate mold heated to 120° C., and subjected to a press-molding process for 20 minutes under a pressure of 10 kg/cm². The resulting sheet-shaped cured product had neither irregularities nor defects on its surface. Consequently, it had superior moldability.

The thermal conductivity of this sheet-shaped cured product was 3.3 W/m·K, thereby making it possible to exert a superior heat-releasing property. When its flexibility (hardness) was measured, a value of 49 was obtained. The hardness was measured by using an Asker rubber A-type hardness tester made by Koubunshi Keiki Co., Ltd. at 25° C. in accordance with a durometer hardness test (type-A test) under JIS K 6253.

Experiment 2 (Experiments Relating to a Resin Composition in which a (meth)acrylic Polymer (I-a) is Synthesized in a Liquid-state Plasticizer)

Production Examples 1 to 5

Into a glass container equipped with a stirring device, a gas introducing pipe, a thermometer, a reflux condenser and a dropping funnel were charged a first (meth)acrylic polymerizable monomer [and a second (meth)acrylic polymerizable monomer, if necessary], a first liquid-state plasticizer and a chain transfer agent, and the inner gas of the container was replaced with a nitrogen gas so that the oxygen concentration of the gaseous phase portion inside the reaction container was set to 0.1 mass % (charging stage). This was heated to a predetermined temperature (A), and a polymerization initiator, diluted with a diluting liquid-state plasticizer, if necessary, was dropped through the dropping funnel over a predetermined period of time (reaction starting stage). Next, the resulting mixture was continuously stirred at a predetermined temperature (B) for a predetermined period of time (reaction continuing stage). Thereto was further added a polymerization initiator, if necessary, and the stirring process was continuously carried out at a predetermined temperature (C) for a predetermined period of time (reaction maturing stage). Air was blown into this to be cooled, and the polymerization process was completed so that mixtures 2-A to 2-E containing polymers 2-A to 2E, etc. were obtained. Here, in any of Examples, there was no uncontrollable progress in the polymerization reaction. Those processes are shown in the following Table 3, in detail. In Production Example 5, a polyether ester-based liquid-state plasticizer (made by Asahi Denka Co., Ltd., tradename: "ADK-Cizer RS700") was used; however, this liquid-state plasticizer had a big mass loss rate (2.95%), and failed to satisfy the scope of the present invention.

TABLE 3

(Experiment 2)

|  |  | Production Example 1 | Production Example 2 | Production Example 3 |
|---|---|---|---|---|
| Charging stage | First (meth)acrylic monomer | Lauryl methacrylate 70 parts by mass | 2-ethylhexyl acrylate 40 parts by mass | 2-ethylhexyl acrylate 70 parts by mass |
|  | First liquid-state plasticizer | Trimellitic acid ester 30 parts by mass[*1] | Trimellitic acid ester 55 parts by mass[*1] | Trimellitic acid ester 30 parts by mass[*1] |
|  | Chain transfer agent | α-methyl styrene dimer 0.3 part by mass | α-methyl styrene dimer 0.1 part by mass | α-methyl styrene dimer 0.5 part by mass |
|  | Gaseous-phase portion oxygen concentration[*2] | 0.1% | 0.0% | 0.0% |
| Reaction starting stage | Polymerization initiator | Azoisobutyronitrile 0.08 part by mass | Dimethyl 2,2-azobis (2-methyl propionate) 0.1 part by mass | Azoisobutyronitrile 0.05 part by mass |
|  | Diluting liquid-state plasticizer | — | Trimellitic acid ester 5 parts by weight | — |
|  | Temperature (A)/dropping time | 80° C./quickly | 75° C./2 hours | 80° C./quickly |
| Reaction continuous stage | Temperature (B)/continuous time | Until the viscosity at 80° C./25° C. has reached 2000 mPa · s | 75° C./1.5 hours | Until the viscosity at 80° C./25° C. has reached 2000 mPa · s |
| Reaction maturing stage | Polymerization initiator | — | Dimethyl 2,2-azobis (2-methyl propionate) 0.02 part by mass | — |
|  | Temperature (C)/maturing time | — | 90° C./2 hours | — |
|  | Polymerization rate | 57% | 99.9% | 57% |
| Reaction mixture | Name | Mixture 2-A | Mixture 2-B | Mixture 2-C |
| Composition | (Meth)acrylic monomer | 30% by mass | 0.04% by mass | 30% by mass |
|  | (Meth)acrylic polymer | 40% by mass | 40% by mass | 40% by mass |
|  | Liquid-state plasticizer | 30% by mass | 60% by mass | 30% by mass |
| Viscosity | Rotor No./number of revolutions | No. 2/12 rpm | No. 3/12 rpm | No. 2/12 rpm |
|  | Measured value (25° C.) | 2250 mPa · s | 8500 mPa · s | 1800 mPa · s |
| Polymer properties | Name | Polymer 2-A | Polymer 2-B | Polymer 2-C |
|  | Weight average molecular weight Mw | 156000 | 506000 | 145000 |
|  | Number average molecular weight Mn | 61000 | 101000 | 59000 |
|  | Glass transition temperature Tg | −65° C. | −60° C. | −63° C. |

|  |  | Production Example 4 | Production Example 5 |
|---|---|---|---|
| Charging stage | First (meth)acrylic monomer | 2-ethylhexyl acrylate 60 parts by mass | 2-ethylhexyl acrylate 40 parts by mass |
|  | First liquid-state plasticizer | Trimellitic acid ester 40 parts by mass[*1] | Polyether ester 55 parts by mass[*4] |
|  | Chain transfer agent | α-methyl styrene dimer 0.4 part by mass | α-methyl styrene dimer 0.3 part by mass |
|  | Gaseous-phase portion oxygen concentration[*2] | 0.0% | 0.1% |
| Reaction starting stage | Polymerization initiator | Azoisobutyronitrile 0.05 part by mass | Dimethyl 2,2-azobis (2-methyl propionate) 0.1 part by mass |
|  | Diluting liquid-state plasticizer | — | Polyether ester 5 parts by mass[*4] |
|  | Temperature (A)/dropping time | 80° C./quickly | 75° C./2 hours |
| Reaction continuous stage | Temperature (B)/continuous time | Until the viscosity at 80° C./25° C. has reached 2000 mPa · s | 75° C./1.5 hours |
| Reaction maturing stage | Polymerization initiator | — | Dimethyl 2,2-azobis (2-methyl propionate) 0.02 part by mass |
|  | Temperature (C)/maturing time | — | 90° C./2 hours |
|  | Polymerization rate | 50% | 99.9% |
| Reaction mixture | Name | Mixture 2-D | Mixture 2-E |
| Composition | (Meth)acrylic monomer | 30% by mass | 0.04% by mass |
|  | (Meth)acrylic polymer | 30% by mass | 40% by mass |
|  | Liquid-state plasticizer | 40% by mass | 60% by mass |

TABLE 3-continued (Experiment 2)

|  |  |  |  |  |
|---|---|---|---|---|
| | Viscosity | Rotor No./number of revolutions | No. 2/12 rpm | No. 3/12 rpm |
| | | Measured value (25° C.) | 2050 mPa · s | 6500 mPa · s |
| Polymer properties | | Name | Polymer 2-D | Polymer 2-E |
| | | Weight average molecular weight Mw | 185000 | 406000 |
| | | Number average molecular weight Mn | 79000 | 81000 |
| | | Glass transition temperature Tg | −63° C. | −60° C. |

[1] made by Asahi Denka Co., Ltd., tradename: "ADK-Cizer C880", viscosity: 100 mPa · s (25° C.), mass loss rate after having been maintained at 130° C. for 24 hours: 0.07% by mass, solidifying point: −21° C.
[2] measured by an oxygen densitometer (Model No. UC-12) made by Central Science Co., Ltd.
[3] set so that a hydroxyl-group-containing monomer accounts for 3 mol % in the entire polymerizable monomer
[4] made by Asahi Denka Co., Ltd., tradename: "ADK-Cizer RS700", viscosity: 30 mPa · s (25° C.), mass loss rate after having been maintained at 130° C. for 24 hours: 2.95% by mass, solidifying point: −53° C.

In Table 3, the polymerization rate was found by calculating the amount of the residual first (meth)acrylic polymerizable monomer using gas chromatography (GC).

Preparation Examples 1 to 5

The above-mentioned mixtures 2-A to 2-E were mixed with various other substances at ratios shown in the following Table 4 so that (meth)acrylic liquid-state resin compositions 2-A to 2-E having compositions shown in the following Table 4 were prepared.

Those resins that virtually contain a (meth)acrylic polymerizable monomer are cured through radical polymerization (thermal polymerization), and consequently, referred to as "polymerizable resin".

TABLE 4

(Experiment 2)

| | | Name | Preparation Example 1 Methacrylic polymerizable liquid-state resin composition 2-A | Preparation Example 2 Acrylic polymerizable liquid-state resin composition 2-B | Preparation Example 3 Acrylic polymerizable liquid-state resin composition 2-C | Preparation Example 4 Acrylic polymerizable liquid-state resin composition 2-D | Preparation Example 5 Acrylic polymerizable liquid-state resin composition 2-E |
|---|---|---|---|---|---|---|---|
| Mixture ratio | Mixture | | Mixture 2-A 99.5 parts by mass | Mixture 2-B 60 parts by mass | Mixture 2-C 99.5 parts by mass | Mixture 2-D 70 parts by mass | Mixture 2-E 60 parts by mass |
| | Additional (meth)acrylic monomer | | — | 2-ethylhexyl acrylate 49.5 parts by mass | — | 2-ethylhexyl acrylate 29.5 parts by mass | 2-ethylhexyl acrylate 49.5 parts by mass |
| | Polyfunctional monomer | | Polyethylene glycol dimethacrylate [1] 0.5 part by mass | Polyethylene glycol dimethacrylate [1] 0.5 part by mass | Polyethylene glycol dimethacrylate [1] 0.5 part by mass | Polyethylene glycol dimethacrylate [1] 0.5 part by mass | Polyethylene glycol dimethacrylate [1] 0.5 part by mass |
| | Polymerization inhibitor | | — | Hydroquinone 0.05 part by mass | — | — | Hydroquinone 0.05 part by mass |
| Composition | A: (Meth)acrylic monomer | | 30% by mass | 45% by mass | 30% by mass | 50% by mass | 45% by mass |
| | B: (Meth)acrylic polymer | | 40% by mass | 22% by mass | 40% by mass | 21% by mass | 22% by mass |
| | C: Liquid-state plasticizer | | 30% by mass | 33% by mass | 30% by mass | 28% by mass | 33% by mass |
| | D: Polyfunctional monomer | | 0.5% by mass | 0.5% by mass | 0.5% by mass | 0.5% by mass | 0.5% by mass |
| | A/B | | 75/100 | 207/100 | 75/100 | 241/100 | 207/100 |
| | D/(A + B) | | 0.7/100 | 0.7/100 | 0.7/100 | 0.7/100 | 0.7/100 |
| Viscosity | Rotor No./number of revolutions | | No. 2/12 rpm | No. 1/12 rpm | No. 2/12 rpm | No. 1/12 rpm | No. 1/12 rpm |
| | Measured value (25° C.) | | 2150 mPa · s | 250 mPa · s | 1800 mPa · s | 310 mPa · s | 180 mPa · s |

[1] made by Kyoei Chemical Co., tradename: "Light Ester 9EG"

No. 2-1

Polymerizable liquid-state methacrylic resin composition 2-A(100 parts by mass), t-amyl peroxy-2-ethylhexanoate (made by Kayaku Akzo Corporation: tradename: "Trigonox 121-50E") (1 part by mass) serving as a radical polymerization initiator, an antifoamer (the aforementioned "A-515") (0.1 part by mass), aluminum oxide (the aforementioned AS-10; thermal conductivity 30 W/m·K) (400 parts by mass) were uniformly kneaded, and then defoamed. The above-mentioned defoamed matter was poured into a glass cell on the bottom of which a PET film that had been subjected to a releasing treatment was affixed so as to have a thickness of 1 mm, and this was heated in an oven at 100° C. for one hour, and then at 120° C. for one hour to be polymerized (cured).

Nos. 2-1 to 2-5

The same processes as those of No. 2-1 were carried out except that in place of the polymerizable liquid-state methacrylic resin composition 2-A, polymerizable liquid-state acrylic resin compositions 2-B to 2-E were used.

The resulting sheet-shape cured products obtained in Nos. 2-1 to 2-5 were evaluated in the same manner as in the aforementioned Experiment 1. Here, with respect to the heat resistant decomposing property, the heating process of the sheet-shaped cured product at 130° C. was prolonged to 336 hours as well as to 504 hours so that the hardness was examined in the same manner as described earlier.

resistant decomposing property (see FIG. 5). In the case of No. 2-5 in which a polyether ester-based material that was inferior in heat resistance was used as the liquid-state plasticizer, the mass loss rate after the heating process was high, indicating degradation in the heat resistant property (see FIG. 5).

Experiment 3 (Experiments Relating to a Resin Composition in which Polymer (I) is a Crosslinking Polymer (I-b))

Synthesis Example 3

Into a container equipped with a thermometer, a stirring device, a gas introducing pipe, a reflux condenser and a dropping funnel were charged 39.48 parts of 2EHA, 0.52 part of 2-hydroxyethyl acrylate (HEA) (with a hydroxyl-group-containing monomer being set to 2 mol % in the entire polymerizable monomers), 50 parts of trimellitic acid ester-based liquid-state plasticizer (the aforementioned "ADK-Cizer C880") serving as a liquid-state plasticizer, and the inner gas of the container was replaced with a nitrogen gas. This was heated to 75° C., and a mixture of 0.05 part of dimethyl 2,2-azobis (2-methyl propionate) serving as a polymerization initiator and 10 parts of a trimellitic acid ester-based liquid-state plasticizer (the aforementioned "ADK-Cizer C880") was charged into the dropping funnel, and dropped into the

TABLE 5

(Experiment 2)

| | No. | | | | |
|---|---|---|---|---|---|
| | 2-1 | 2-2 | 2-3 | 2-4 | 2-5 |
| Liquid-state resin composition to be used | Methacrylic polymerizable liquid-state resin composition 2-A | Methacrylic polymerizable liquid-state resin composition 2-B | Methacrylic polymerizable liquid-state resin composition 2-C | Methacrylic polymerizable liquid-state resin composition 2 D | Methacrylic polymerizable liquid-state resin composition 2-E |
| Sheet initial hardness (C type) | 23 | 21 | 23 | 21 | 21 |
| Sheet initial thermal conductivity (W/m · K) | 1.5 W/m · k | 1.6 W/m · k | 1.6 W/m · k | 1.6 W/m · k | 1.5 W/m · k |
| Heat resistance  Mass loss rate (%) | 0.4% | 0.3% | 0.2% | 0.2% | 3.8% |
| Sheet hardness (C type) | 26 | 24 | 24 | 23 | 41 |
| Thermal conductivity (W/m · K) | 1.6 W/m · k | 1.6 W/m · k | 1.6 W/m · k | 1.6 W/m · k | 1.6 W/m · k |
| Durability (Δ hardness) | +3 | +3 | +1 | +2 | +20 |
| Heat resistant decomposing property: 336 hrs later | 27 | 25 | 25 | 24 | 70 |
| Heat resistant decomposing property: 504 hrs later | 30 | 27 | 27 | 24 | >100 |

Each of polymerizable liquid-state resin compositions 2-A to 2-D makes it possible to reduce the amount of use of the liquid-state plasticizer, with the viscosity being maintained in a low level (see Table 4). Moreover, in comparison with liquid-state methacrylic resin composition 2-A, liquid-state acrylic resin compositions 2-B to 2-D further achieve a low-level viscosity (see Table 4). Here, liquid-state resin compositions 2-A to 2-D can be produced without using virtually any special catalyst and solvent. It is in particular notable that liquid-state acrylic resin compositions 2-B to 2-D can be produced without virtually using any special catalyst and solvent.

Moreover, the cured products obtained from polymerizable liquid-state resin compositions 2-A to 2-D were free from bleeding even after having been heated for a very long period of time at high temperature, and had a superior heat-container in three hours. Thereto was further added 0.02 part of dimethyl 2,2-azobis (2-methyl propionate) serving as a polymerization initiator, and the resulting mixture was heated to 90° C. and allowed to undergo a polymerization reaction for 3 hours. Prior to the completion of the polymerization reaction, 0.4 part of dibutyltin dilaurate serving as crosslinking accelerator was added thereto and air was further blown thereto to cool the system so that the polymerization was completed; thus, a mixture of an acrylic copolymer containing 2-mol % hydroxyl group serving as a crosslinking polymer and a trimellitic acid ester-based liquid-state plasticizer (hereinafter, referred to as acrylic resin 3-A) was obtained. The residual 2EHA, confirmed by gas chromatography (GC), was 0.1%, and the acrylic copolymer containing 2-mol % hydroxyl group, serving as a crosslinking polymer in the acrylic resin 3-A, was 39.9%.

The viscosity of the resulting acrylic resin 3-A at 25° C. was 12980 mPa·s. With respect to the molecular weight of the polymer measured by GPC, the weight-average molecular weight Mw was 1106000 and the number-average molecular weight Mn was 101000. Moreover, the glass transition point temperature of the acrylic copolymer containing 2-mol % hydroxyl-group serving as a crosslinking polymer, measured by a differential scanning calorimeter according to a conventional method, was −64° C.

Synthesis Example 4

The same processes as those of Synthesis Example 3 were carried out except that the charged materials into the reaction container were changed to 39.70 parts of 2EHA, 0.30 part of HEA (with a hydroxyl-group-containing monomer being set to 1 mol % in the entire polymerizable monomers) and 50 parts of trimellitic acid ester-based liquid-state plasticizer (the aforementioned "ADK-Cizer C880") serving as a liquid-state plasticizer so that a mixture of an acrylic copolymer containing 1-mol % hydroxyl group serving as a crosslinking polymer and a trimellitic acid ester-based liquid-state plasticizer (hereinafter, referred to as acrylic resin 3-B) was obtained.

The residual 2EHA, confirmed by gas chromatography (GC), was 0.1%, and the acrylic copolymer containing 1-mol % hydroxyl group, serving as a crosslinking polymer in the acrylic resin 3-B, was 39.9%. The viscosity of the resulting acrylic resin 3-B at 25° C. was 11500 mPa·s. With respect to the molecular weight of the polymer measured by GPC, the weight-average molecular weight Mw was 1006000 and the number-average molecular weight Mn was 105000. Moreover, the glass transition point temperature of the acrylic copolymer containing 1-mol % hydroxyl group, measured by a differential scanning calorimeter according to a conventional method, was −62° C.

Synthesis Example 5

The same processes as those of Synthesis Example 3 were carried out except that the trimellitic acid ester-based liquid-state plasticizer was changed to the aforementioned "ADK-Cizer C79" so that a mixture of an acrylic copolymer containing 2-mol % hydroxyl group serving as a crosslinking polymer and a trimellitic acid ester-based liquid-state plasticizer (hereinafter, referred to as acrylic resin 3-C) was obtained. The residual 2EHA, confirmed by gas chromatography (GC), was 0.1%, and the acrylic copolymer containing 2-mol % hydroxyl group, serving as a crosslinking polymer in the acrylic resin 3-C, was 39.9%. The viscosity of the resulting acrylic resin 3-C at 25° C. was 11500 mPa·s. With respect to the molecular weight of the polymer measured by GPC, the weight-average molecular weight Mw was 1106000 and the number-average molecular weight Mn was 135000. Moreover, the glass transition point temperature of the acrylic copolymer containing 2-mol % hydroxyl group, measured by a differential scanning calorimeter according to a conventional method, was −65° C.

No. 3-1

To 100 parts of a liquid-state resin composed of 62 parts of the acrylic resin 3-A and 38 parts of the trimellitic acid-based liquid-state plasticizer (the aforementioned "ADK-Cizer C880" (a liquid-state resin containing about 25% of a 2-mol % hydroxyl-group-containing acryl-based copolymer serving as a crosslinking polymer and 75% of a liquid-state plasticizer) were added 0.1 part of an antifoamer (the aforementioned "A-515") and 0.86 part of isophorone diisocyanate (in which the amount of isocyanate was mole equivalent to the amount of hydroxyl groups of the acrylic copolymer in the liquid-state resin) serving as a crosslinking agent, and the resulting mixture was defoamed, and poured into a glass cell having a PET film that was set to a thickness of 15 mm and had been subjected to a releasing treatment, and this was heated in an oven at 80° C. for 2 hours so that the liquid-state resin was gelled to prepare a plate-shaped cured product.

Next, 100 parts of the liquid-state resin, 0.1 part of the antifoamer (the aforementioned "A-515"), 0.86 part of isophorone diisocyanate serving as a crosslinking agent, 200 parts of aluminum oxide having a thermal conductivity of 30 W/m·K (the aforementioned AS-10) were uniformly kneaded to prepare a resin composition for a thermal conductive material. Thereafter, the resin composition for a thermal conductive material was subjected to a defoaming process, and poured into a glass cell having a PET film with a thickness of 1 mm, which had been subjected to a releasing treatment, and heated at 80° C. for two hours so that the reaction between the hydroxyl group and the isocyanate group in the composition was completed to prepare a sheet-shaped cured product of the resin composition for a thermal conductive material. With respect to the plate-shaped cured product and the sheet-shaped cured product, the properties thereof were evaluated in the same manner as in Experiment 1, and the results are shown in Table 6. Here, the evaluation on the heat resistance was carried out at 100° C. for 168 hours.

No. 3-2

The same processes as those of No. 3-1 were carried out except that 100 parts of a liquid-state resin containing 75 parts of the acrylic resin 3-A and 25 parts of the trimellitic acid-based liquid-state plasticizer (the aforementioned "ADK-Cizer C880") (a liquid-state resin containing about 30% of a 2-mol % hydroxyl-group-containing acryl-based copolymer serving as a crosslinking polymer and 70% of a liquid-state plasticizer), with 1.03 parts of isophorone diisocyanate (in which the amount of isocyanate was mole equivalent to the amount of hydroxyl groups of the acrylic copolymer in the liquid-state resin) serving as a crosslinking agent being added thereto, were used so that a plate-shaped cured product of the liquid-state resin and a sheet-shaped cured product of the resin composition for a thermal conductive material were obtained. These were evaluated in the same manner as in No. 3-1, and the results are shown in Table 6.

No. 3-3

The same processes as those of No. 3-1 were carried out except that 100 parts of a liquid-state resin containing 62 parts of the acrylic resin 3-B and 38 parts of the trimellitic acid-based liquid-state plasticizer (the aforementioned "ADK-Cizer C880") (a liquid-state resin containing about 25% of a 1-mol % hydroxyl-group -containing acryl-based copolymer serving as a crosslinking polymer and about 75% of a liquid-state plasticizer), with 0.43 part of isophorone diisocyanate serving as a crosslinking agent being added thereto, were used so that a plate-shaped cured product of the liquid-state resin and a sheet-shaped cured product of the resin composition for a thermal conductive material were obtained. These were evaluated in the same manner as in No. 3-1, and the results are shown in Table 6.

No. 3-4

The same processes as those of No. 3-1 were carried out except that 100 parts of a liquid-state resin containing 75 parts of the acrylic resin 3-B and 25 parts of the trimellitic acid-based liquid-state plasticizer (the aforementioned "ADK- Cizer C880") (a liquid-state resin containing about 30% of a 1-mol % hydroxyl-group-containing acryl-based copolymer serving as a crosslinking polymer and about 70% of a liquid-state plasticizer), with 0.52 part of isophorone diisocyanate serving as a crosslinking agent being added thereto, were used so that a plate-shaped cured product of the liquid-state resin and a sheet-shaped cured product of the resin composition for a thermal conductive material were obtained. These were evaluated in the same manner as in No. 3-1, and the results are shown in Table 6.

No. 3-5

The same processes as those of No. 3-1 were carried out except that 100 parts of a liquid-state resin containing 62 parts of the acrylic resin 3-C and 38 parts of the trimellitic acid-based liquid-state plasticizer (the aforementioned "ADK-Cizer C79") (a liquid-state resin containing about 25% of a 2-mol % hydroxyl- group-containing acryl-based copolymer serving as a crosslinking polymer and about 75% of a liquid-state plasticizer) was used so that a plate-shaped cured product of the liquid-state resin and a sheet-shaped cured product of the resin composition for a thermal conductive material were obtained. These were evaluated in the same manner as in No. 3-1, and the results are shown in Table 6.

No. 3-6

The same processes as those of No. 3-1 were carried out except that 100 parts of a liquid-state resin containing 75 parts of the acrylic resin 3-C and 25 parts of the trimellitic acid-based liquid-state plasticizer (the aforementioned "ADK-Cizer C79") (a liquid-state resin containing about 30% of a 2-mol % hydroxyl-group-containing acryl-based copolymer serving as a crosslinking polymer and about 70% of a liquid-state plasticizer) was used so that a plate-shaped cured product of the liquid-state resin and a sheet-shaped cured product of the resin composition for a thermal conductive material were obtained. These were evaluated in the same manner as in No. 3-1, and the results are shown in Table 6.

No. 3-7

The same processes as those of No. 3-1 were carried out except that the aluminum oxide was changed to 100 parts of boron nitride having a thermal conductivity of 50 W/m·K (made by KCM Corporation; Item No. BN-100) so that a plate-shaped cured product of the liquid-state resin and a sheet-shaped cured product of the resin composition for a thermal conductive material were obtained. These were evaluated in the same manner as in No. 3-1, and the results are shown in Table 6.

No. 3-8

The same processes as those of No. 3-1 were carried out except that the aluminum oxide was changed to 200 parts of aluminum nitride having a thermal conductivity of 120 W/m·K (made by Toyo Aluminum K.K.; Item No. R-15) so that a plate-shaped cured product of the liquid-state resin and a sheet-shaped cured product of the resin composition for a thermal conductive material were obtained. These were evaluated in the same manner as in No. 3-1, and the results are shown in Table 6.

No. 3-9 (for Use in Comparison)

Into a container equipped with a thermometer, a stirring device, a gas introducing pipe, a reflux condenser and a dropping funnel were charged 39.70 parts of 2EHA, 0.30 part of HEA (with a hydroxyl-group-containing monomer being set to 1 mol % in the entire monomers), 50 parts of toluene and 0.2 part of α-methyl styrene serving as a chain transfer agent, and the inner gas of the container was replaced with a nitrogen gas. This was heated to 80° C., and a mixture of 0.05 part of azoisobutyronitrile serving as a polymerization initiator and 10 parts of toluene was charged into the dropping funnel, and dropped into the container in two hours. To this was further added 0.01 part of azoisobutyronitrile, and the resulting mixture was heated to 90° C. and allowed to undergo a polymerization reaction for 3 hours. Prior to the completion of the polymerization reaction, 0.4 part of dibutyltin dilaurate serving as a crosslinking accelerator was added thereto and air was further blown thereto to cool the system so that the polymerization was completed; thus, a toluene solution of the resin, containing 40% of 1-mol % hydroxyl-group-containing copolymer serving as a crosslinking polymer, was obtained. With respect to the molecular weight of the copolymer measured by GPC, the weight-average molecular weight Mw was 306000 and the number-average molecular weight Mn was 101000. Moreover, the glass transition point temperature of the polymer, measured by a differential scanning calorimeter according to a conventional method, was −60° C.

Next, a mixture, prepared by adding 0.69 part of isophorone diisocyanate (in which the amount of isocyanate was mole equivalent to the amount of hydroxyl groups of the crosslinking polymer in the liquid-state resin) serving as a crosslinking agent to 100 parts of the toluene solution of the resin containing no liquid-state plasticizer as an essential component of its liquid-state resin component, was developed on a PET film that was set to a thickness of 15 mm and had been subjected to a releasing treatment, and the toluene was completely distilled off under reduced pressure of the system. Next, this was heated in an oven at 80° C. for two hours so that the hydroxyl group and isocyanate were allowed to react in the polymer to obtain a gelled matter. The resulting gelled matter was evaluated in the same manner as in No. 3-1, and the results are shown in Table 6.

Next, to 100 parts of the toluene solution of the resin were added 0.69 part of isophorone diisocyanate serving as a crosslinking agent and 80 parts of aluminum oxide (the aforementioned AS-10) (the amount of addition of which was 200 parts based on 100 parts of the crosslinking polymer in the toluene solution of the resin), and this was uniformly kneaded to prepare a resin composition for a thermal conductive material. Thereafter, the resin composition for a thermal conductive material was developed on a PET film that had been subjected to a releasing treatment so as to form a thickness of 1 mm, and the toluene was completely distilled off under reduced pressure in the system. Next, this was heated in an oven at 80° C. for two hours so that the hydroxyl group and isocyanate were allowed to react in the polymer to obtain a cured product of a sheet-shaped resin composition for a thermal conductive material. The resulting sheet was evaluated in the same manner as in No. 3-1. The results of the evaluation are shown in Table 6.

The value of hardness of the gel obtained in No. 3-9 for use in comparison was 95. This is presumably because the gel was not obtained by holding the liquid-state plasticizer in the crosslinking polymer with the result that the hardness of the gel became high to cause deterioration in flexibility. Moreover, the initial hardness of the sheet was 70, which was greater than any of the cured products obtained in Examples of the present invention. Consequently, in the case when the cured product is interposed between a heat-generating body, such as a PDP, an electric part and an electronic part, and a thermal conductive body, such as a heat sink, a thermal conductive fin and a metal plate, so that the heat generated from the PDP, the electric part or the electronic part is heat-released, the contact area with these members tends to become smaller, resulting in degradation in the heat-releasing property. Moreover, the sheet hardness after the heat resistance test was 89 with a mass loss rate of 0.6%, and the amount of change in the hardness before and after the tests was greater than any of those obtained in Examples of the present invention. For this reason, it is clear that this sheet fails to provide a long-term flexibility, resulting in a failure to provide a stable heat-releasing property.

No. 3-10 (for Use in Comparison)

Toluene was completely distilled off from the toluene solution of the resin obtained in No. 3-9 to prepare a 1-mol % hydroxyl-group-containing copolymer serving as a crosslinking polymer.

To 100 parts of a thermo-softening resin containing 75 parts of the 1-mol % hydroxyl-group-containing copolymer serving as a crosslinking polymer and 25 parts of paraffin (made by Nippon Seiro Co., Ltd.; Item No. Paraffin Wax 115) serving as a thermosoftener that was in a solid state at normal temperature with a melting point of 47° C. (that is, no liquid-state plasticizer that was essential for the liquid-state resin was contained) was added 1.30 parts of isophorone diisocyanate (which was mole equivalent to the amount of hydroxyl groups of the crosslinking polymer in the thermosoftening resin) serving as a crosslinking agent to prepare a mixture, and this was developed on a PET film that had been subjected to a releasing treatment to be set to a thickness of 15 mm, and heated in an oven at 80° C. for two hours so that the hydroxyl group and isocyanate were allowed to react in the polymer to obtain a gelled matter. The resulting gelled matter was evaluated in the same manner as in No. 3-1, and the results are shown in Table 6.

Next, 100 parts of the thermosoftening resin, 1.30 parts of isophorone diisocyanate serving as a crosslinking agent and 200 parts of aluminum oxide having a thermal conductivity of 30 W/m·K (the aforementioned AS-10) were kneaded at 50° C. for 30 minutes by using a pressurized kneader. Thereafter, this was extruded into a gap between 2 sheets of PET films to be set to a thickness of 1 mm by using an extruder so that a sheet-shaped resin composition for a thermal conductive material was prepared. The resulting sheet-shaped resin composition for a thermal conductive material was heated at 80° C. for 2 hours so that the reaction between the hydroxyl group and isocyanate group in the composition was completed. The resulting sheet was evaluated in the same manner as in No. 3-1, and the results are shown in Table 6.

The value of hardness of the resulting gel was 90. This is presumably because the gel was not obtained by holding the liquid-state plasticizer in the crosslinking polymer with the result that the hardness of the gel became high to cause deterioration in flexibility. Moreover, the initial hardness of the sheet was 60, which was greater than any of the cured products obtained in Examples of the present invention. Consequently, in the case when the cured product is interposed between a heat-generating body, such as a PDP, an electric part and an electronic part, and a thermal conductive body, such as a heat sink, a thermal conductive fin and a metal plate, so that the heat generated from the PDP, the electric part or the electronic part is heat-released, the contact area with these members tends to become smaller, resulting in degradation in the heat-releasing property.

Here, the resulting sheet was uniform without a separation between the resin and the applied inorganic filler; however, there were irregularities and bubbles on the surface, and was inferior in the surface smoothness. In other words, the sheet was inferior in the moldability.

Moreover, as a result of heat resistant tests, the mass loss rate was 6.1%, with the sheet hardness exceeding the maximum value 100. This is presumably because the mass loss rate became greater due to evaporation of the thermosoftening agent applied thereto to cause a change in hardness. Consequently, the resulting sheet failed to have flexibility for a long period of time, resulting in degradation in stable heat-releasing property. Moreover, a number of swellings occurred on the sheet after the heat resistant test.

Here, the meanings of abbreviations used in Table 6 are explained as follows:

C880: Liquid-state plasticizer made by Asahi Denka Co., Ltd., tradename: "ADK-Cizer C880"

C79: Liquid-state plasticizer made by Asahi Denka Co., Ltd., tradename: "ADK-Cizer C79"

Crosslinking agent: Isophorone diisocyanate

A-515: Antifoamer made by BYK-Chemie Japan KK, tradename: "A-515"

Δhardness: Hardness difference between the sheet initial hardness value and the sheet hardness value after the heat-resistant test

TABLE 6

(Experiment 3)

| | | | No. | | | | | | | | | |
|---|---|---|---|---|---|---|---|---|---|---|---|---|
| | | | 3-1 | 3-2 | 3-3 | 3-4 | 3-5 | 3-6 | 3-7 | 3-8 | 3-9 | 3-10 |
| Components of resin composition | Components of liquid-state resin | Resin 3-A | 62 | 75 | 0 | 0 | 0 | 0 | 62 | 62 | 0 | 0 |
| | | Resin 3-B | 0 | 0 | 62 | 75 | 0 | 0 | 0 | 0 | 0 | 0 |
| | | Resin 3-C | 0 | 0 | 0 | 0 | 62 | 75 | 0 | 0 | 0 | 0 |
| | | C880 | 38 | 25 | 38 | 25 | 0 | 0 | 38 | 38 | 0 | 0 |
| | | C79 | 0 | 0 | 0 | 0 | 38 | 25 | 0 | 0 | 0 | 0 |
| | | Toluene solution of the resin | 0 | 0 | 0 | 0 | 0 | 0 | 0 | 0 | 100 | 0 |
| | | Thermo-softening resin | 0 | 0 | 0 | 0 | 0 | 0 | 0 | 0 | 0 | 100 |
| | | Crosslinking agent | 0.86 | 1.03 | 0.43 | 0.52 | 0.86 | 1.03 | 0.86 | 0.86 | 0.69 | 1.30 |
| | | A-515 | 0.1 | 0.1 | 0.1 | 0.1 | 0.1 | 0.1 | 0.1 | 0.1 | 0 | 0 |
| | | Aluminum oxide | 200 | 200 | 200 | 200 | 200 | 200 | 0 | 0 | 80 | 200 |
| | | Boron nitride | 0 | 0 | 0 | 0 | 0 | 0 | 100 | 0 | 0 | 0 |
| | | Aluminum nitride | 0 | 0 | 0 | 0 | 0 | 0 | 0 | 200 | 0 | 0 |

TABLE 6-continued (Experiment 3)

| | | No. | | | | | | | | | |
|---|---|---|---|---|---|---|---|---|---|---|---|
| | | 3-1 | 3-2 | 3-3 | 3-4 | 3-5 | 3-6 | 3-7 | 3-8 | 3-9 | 3-10 |
| Gel hardness (F type) | | 35 | 58 | 18 | 28 | 34 | 58 | 35 | 58 | 95 | 90 |
| Sheet moldability | | ○ | ○ | ○ | ○ | ○ | ○ | ○ | ○ | ○ | x |
| Sheet initial hardness (C type) | | 28 | 38 | 18 | 25 | 29 | 39 | 18 | 35 | 70 | 60 |
| Sheet initial thermal conductivity (W/m·K) | | 1.0 | 1.1 | 1.1 | 1.1 | 1.1 | 1.1 | 1.6 | 1.9 | 1.1 | 1.0 |
| Heat | Mass loss rate (%) | 0.3 | 0.4 | 0.4 | 0.4 | 0.3 | 0.3 | 0.3 | 0.4 | 0.6 | 6.1 |
| resistance | Sheet hardness (C type) | 29 | 39 | 18 | 25 | 30 | 41 | 19 | 37 | 89 | >100 |
| | Thermal conductivity (W/m·K) | 1.0 | 1.1 | 1.1 | 1.1 | 1.0 | 1.1 | 1.6 | 1.9 | 1.1 | 0.9 |
| Durability (Δ hardness) | | 1 | 1 | 0 | 0 | 1 | 2 | 1 | 2 | 19 | — |

Experiment 4 (Experiments Relating to a Resin Composition in which Polymer (I) is a Crosslinking Polymer (I-b))

No. 4-1

Into a container equipped with a thermometer, a stirring device, a gas introducing pipe, a reflux condenser and a dropping funnel were charged 39.7 parts of 2EHA, 0.3 part of HEA (with a hydroxyl-group-containing monomer being set to 1-mol % in the entire polymerizable monomers), 50 parts of phthalic acid ester-based liquid-state plasticizer (the aforementioned "Vinycizer 124"), and the inner gas of the container was replaced with a nitrogen gas. This was heated to 80° C., and a mixture of 0.05 part of azoisobutyronitrile serving as a polymerization initiator and 10 parts of the phthalic acid ester-based liquid-state plasticizer (the aforementioned "Vinycizer 124") was charged into the dropping funnel, and dropped into the container in two hours. To this was further added 0.02 part of azoisobutyronitrile, and the resulting mixture was heated to 90° C. and allowed to undergo a polymerization reaction for 3 hours. Prior to the completion of the polymerization reaction, 60 parts of the liquid-state plasticizer was added thereto and air was further blown thereto to cool the system so that the polymerization was completed. A mixture of an acrylic polymer containing 1 mol % hydroxyl group and a phthalic acid ester-based liquid-state plasticizer (hereinafter, referred to as acrylic resin No. 4-1) was obtained. The residual 2EHA, confirmed by gas chromatography (GC), was 0.1%, and the acrylic polymer containing 1-mol % hydroxyl group in the acrylic resin No. 4-1 was 24.8%.

The viscosity of the resulting acrylic resin No. 4-1 at 25° C. was 1980 mPa·s. With respect to the molecular weight of the polymer measured by GPC, the weight-average molecular weight Mw was 506000 and the number-average molecular weight Mn was 201000. Moreover, the glass transition point temperature of the acrylic polymer containing 1-mol % hydroxyl-group, measured by a differential scanning calorimeter according to a conventional method, was −64° C.

Next, 100 parts of acrylic resin No. 4-1, 0.26 part of isophorone diisocyanate serving as a crosslinking agent (in which the amount of isocyanate was mole equivalent to the amount of hydroxyl groups in acrylic resin No. 4-1) serving as a crosslinking agent, 0.1 part of dibutyltin laurate serving as a crosslinking accelerator and 1300 parts of aluminum oxide having a thermal conductivity of 30 W/m·K (the aforementioned AS-40) were uniformly kneaded by a pressurized kneader at 25° C. for 30 minutes. Thereafter, the kneaded matter was extruded into a gap between two sheets of PET films by using an extruder to be set to a thickness of 1 mm to obtain a sheet-shaped resin composition for a thermal conductive material. Next, the resulting sheet-shaped resin composition for a thermal conductive material was left at room temperature for 24 hours so that the reaction between the hydroxyl group and the isocyanate group in the composition was completed. The sheet for a thermal conductive material (thermal conductive sheet) thus obtained was free from stickiness, and formed a gel-state resin in which the applied phthalic acid ester-based liquid-state plasticizer was held in the crosslinking polymer. Moreover, the sheet was uniform without a separation from the applied thermal conductive filler, and free from bubbles to provide a sheet with superior surface smoothness. In other words, the sheet was superior in its moldability.

Next, the thermal conductivity of the resulting sheet was measured by a quick thermal conductivity meter, made by Kyoto Electronics Manufacturing Co., Ltd, Item No. QTM-500. The thermal conductivity of the resulting sheet was 3.2 W/m·K, which was a high level of thermal conductivity.

Next, in order to evaluate the flexibility of the resulting sheet, a durometer hardness test (type-A test) was carried out at 25° C. in compliance with JIS K 6253 by using an Asker rubber A-type hardness tester made by Koubunshi Keiki Co., Ltd. The pressing stylus of the hardness tester was pushed into the center of the sample so that the pressing face was made in close-contact with the sample; thus, the maximum indicated value within a second from the time of the close-contact was used as the hardness. Here, the sheet that had been laminated to a thickness of 10 mm was used as the sample. The smaller the hardness value, the more flexible the sheet becomes. The rubber hardness of the sheet obtained in this Example was 60.

Next, in order to measure long-term flexibility of the resulting sheet, the sheet was maintained in an oven at 150° C. for 3 hours. In this case, the mass loss rate was 0.7%. Thus, the resulting sheet was also superior in the long-term flexibility.

No. 4-2

The same processes as those of No. 4-1 were carried out except that the aluminum oxide of No. 4-1 was changed to 250 parts of boron nitride having a thermal conductivity of 50 W/m·K (made by KCM Corporation; Item No. BN-100) so that a sheet for a thermal conductive material was obtained, and this was subjected to various evaluations. The resulting sheet was free from stickiness, and formed a gel-state resin in which the applied phthalic acid ester-based liquid-state plasticizer was held in the crosslinking polymer. Moreover, the sheet was uniform without a separation from the applied thermal conductive filler, and free from bubbles to provide a sheet with superior surface smoothness. In other words, the sheet was superior in its moldability. The thermal conductivity of this sheet was 3.5 W/m·K, which was a high level of thermal conductivity. The rubber hardness of the sheet, measured by using an Asker rubber A-type hardness tester in the same manner as in No.4-1, was 20. As a result of evaluation on the long-term flexibility of the resulting sheet, the mass loss rate was 0.8%, and the sheet was superior in its long-term flexibility. No. 4-3 The same processes as those of No. 4-1 were carried out except that the aluminum oxide of No. 4-1 was changed to 700 parts of aluminum nitride having a thermal conductivity of 120 W/m·K (made by Toyo Aluminum K.K.; Item No. R-15) so that a sheet for a thermal conductive material was obtained, and this was subjected to various evaluations. The resulting sheet was free from stickiness, and formed a gel-state resin in which the applied phthalic acid ester-based liquid-state plasticizer was held in the crosslinking polymer. Moreover, the sheet was uniform without a separation from the applied thermal conductive filler, and free from bubbles to provide a sheet with superior surface smoothness. In other words, the sheet was superior in its moldability. The thermal conductivity of this sheet was 3.9 W/m·K, which was a high level of thermal conductivity. The rubber hardness of the sheet, measured by using an Asker rubber A-type hardness tester, was 45. As a result of evaluation on the long-term flexibility of the resulting sheet, the mass loss rate was 0.6%, and the sheet was superior in its long-term flexibility.

No. 4-4

LMA (39 parts), 1 part of polyethylene glycol dimethacrylate (the aforementioned "Light Ester 9EG") serving as a polyfunctional monomer, 2 parts of t-amyl peroxy 3,5,5-trimethyl hexanate (the aforementioned "Kaya Ester AN") serving as a polymerization initiator, 60 parts of phthalic acid ester-based plasticizer (the aforementioned "Vinycizer 124") and 1300 parts of aluminum oxide (the aforementioned AS-40) were kneaded at normal temperature for 30 minutes by using a pressurized kneader. Next, in the same manner as in No. 4-1, this was extruded into a gap between 2 sheets of PET films to be set to a thickness of 1 mm by using an extruder so that a sheet-shaped resin composition for a thermal conductive material was obtained. Next, the resulting sheet was heated in a furnace at 120° C. for 30 minutes so that the polymerization crosslinking reaction was completed. This sheet for a thermal conductive material was evaluated in the same manner as in No. 4-1. The resulting sheet was uniform without a separation from the applied thermal conductive filler, and free from stickiness and bubbles to provide a sheet with superior surface smoothness. In other words, the sheet was superior in its moldability. The thermal conductivity of this sheet was 3.1 W/m·K, which was a high level of thermal conductivity. The rubber hardness of the sheet, measured by using an Asker rubber A-type hardness tester, was 62. As a result of evaluation on the long-term flexibility of the resulting sheet, the mass loss rate was 0.8%, and the sheet was superior in its long-term flexibility.

No. 5 (for Use in Comparison)

Into a container equipped with a thermometer, a stirring device, a gas introducing pipe, a reflux condenser and a dropping funnel were charged 39.7 parts of 2EHA, 0.3 part of HEA (with a hydroxyl-group-containing monomer being set to 1 mol % in the entire monomers), 50 parts of toluene and 0.3 part of a-methyl styrene serving as a chain transfer agent, and the inner gas of the container was replaced with a nitrogen gas. This was heated to 80° C., and a mixture of 0.05 part of azoisobutyronitrile serving as a polymerization initiator and 10 parts of toluene was charged into the dropping funnel, and dropped into the container in two hours. To this was further added 0.01 part of azoisobutyronitrile, and the resulting mixture was heated to 90° C. and allowed to undergo a polymerization reaction for 3 hours. Prior to the completion of the polymerization reaction, air was blown thereto to cool the system so that the polymerization was completed. Next, the toluene was completely distilled off under reduced pressure of the system to obtain a polymer that was in a solid state with 1-mole % hydroxyl groups contained therein. Here, Mw of the polymer, determined by GPC, was 106000, and Mn thereof was 51000. Moreover, the glass transition point temperature of the polymer, measured by a differential scanning calorimeter according to a conventional method, was −60° C.

Next, 100 parts of the resulting polymer, 0.65 part of isophorone diisocyanate (in which the amount of isocyanate was mole equivalent to the amount of hydroxyl groups) serving as a crosslinking agent, 0.3 part of dibutyltin laurate serving as a crosslinking accelerator, 25 parts of paraffin (the aforementioned paraffin wax 115) that served as a thermosoftening agent with a melting point of 47° C. and 1300 parts of aluminum oxide having a thermal conductivity of 30 W/m·K (the aforementioned AS-40) were kneaded by a pressurized kneader at 50° C. for 30 minutes. Thereafter, the kneaded matter was extruded into a gap between two sheets of PET films by using an extruder to be set to a thickness of 1 mm to obtain a sheet-shaped resin composition for a thermal conductive material. Next, the resulting sheet-shaped resin composition for a thermal conductive material was left at room temperature for 24 hours so that the reaction between the hydroxyl group and the isocyanate group in the composition was completed. The sheet thus obtained was evaluated in the same manner as in No. 4-1.

Although the resulting sheet was uniform without a separation between the resin and the applied thermal conductive filler, there were irregularities and bubbles on the surface to cause degradation in the surface smoothness. In other words, the sheet was poor in its moldability. The thermal conductivity of this sheet was 3.1 W/m·K, which was a high level of thermal conductivity. When the rubber hardness of the sheet was measured by using an Asker rubber A-type hardness tester at 25° C., the measured value exceeded 100, which was the limit of measurements, making the measurement unoperable; therefore, the rubber hardness was measured at 50° C. The rubber hardness of this sheet at 50° C. was 65. Consequently, it was found that the resulting sheet was poor in its flexibility. As a result of evaluation on the long-term flexibility of the resulting sheet, the mass loss rate was 0.9%, and the sheet was superior in its long-term flexibility; however, a number of swellings occurred on the sheet after the measurement.

No. 4-6

Into a container equipped with a thermometer, a stirring device, a gas introducing pipe, a reflux condenser and a dropping funnel were charged 38.81 parts of 2EHA, 1.04 parts of HEA (with a hydroxyl-group-containing monomer being set to 4 mol % in the entire monomers), 50 parts of a trimellitic acid ester-based liquid-state plasticizer (the aforementioned "ADK-Cizer C880") serving as a liquid-state plasticizer and 0.15 part of α-methyl styrene dimer serving as a chain transfer agent, and the inner gas of the container was replaced with a nitrogen gas.

This was heated to 75° C., and a mixture of 0.1 part of dimethyl-2,2'-azobis(2-methylpropionate) serving as a polymerization initiator and 10 parts of the liquid-state plasticizer (the above-mentioned "ADK-Cizer C880") was charged into the dropping funnel, and dropped in 1.5 hours. To this was further added 0.03 part of dimethyl-2,2'-azobis(2-methylpropionate) serving as a polymerization initiator, and the resulting mixture was heated to 90° C. and allowed to undergo a polymerization reaction for 2 hours.

Prior to the completion of the polymerization reaction, 60 parts of the liquid-state plasticizer (the above-mentioned "ADK-Cizer C880") was added thereto, and air was blown thereto to cool the system so that the polymerization was completed; thus, a mixture of a 4-mol % hydroxyl-group-containing acrylic polymer and the liquid-state plasticizer (hereinafter, referred to as acrylic resin No. 4-2) was obtained. The residual 2EHA, confirmed by gas chromatography (GC), was 0.1%, and the polymer containing 4-mol % hydroxyl group in acrylic resin No. 4-2 was 24.8%. The viscosity of the resulting acrylic resin No. 2 at 25° C. was 2400 mPa·s. Mw of the polymer, determined by GPC, was 375000 and the number-average molecular weight Mn was 93000. Moreover, the glass transition point temperature, measured by a differential scanning calorimeter according to a conventional method, was −58° C.

The above-mentioned acrylic resin No. 4-2 (100 parts), 0.06 part of dibutyltin dilaurate serving as a crosslinking accelerator, 0.1 part of an antifoamer (the aforementioned "A-515"), 0.57 part of hexamethylene diisocyanate (in which the amount of isocyanate was mole equivalent to the amount of hydroxyl groups of the polymer) serving as a crosslinking agent and 600 parts of aluminum oxide having a thermal conductivity of 30 W/m·K (the aforementioned AS-40) were uniformly kneaded at a rotation speed of 300 rpm for 5 minutes using a Three-one Motor (Item No. 600 G) made by Shinto Scientific Co., Ltd.

Next, the resulting resin composition was placed still in a reduced pressure desiccator the degree of vacuum of which was set to 0.09 MPa for 10 minutes so as to be defoamed, and applied onto a PET film that had been subjected to a releasing treatment by using a bar coater that was set to prepare a thickness of 1 mm. This coated product was heated at 100° C. for two hours to allow the polymer containing hydroxyl groups and hexamethylene diisocyanate to react with each other in the composition so that a sheet for a thermal conductive material was obtained. The resulting sheet was free from stickiness, and formed a gel-state resin in which the liquid-state plasticizer was held in the crosslinking polymer. Moreover, the sheet was uniform without a separation from the applied thermal conductive filler, and free from bubbles to provide a sheet with superior surface smoothness. In other words, the sheet was superior in its moldability. The thermal conductivity of the sheet was 1.8 W/m·K, which was a high level of thermal conductivity.

Moreover, with respect to the evaluation on the heat resistance of the sheet that had been exposed to a high temperature of 130 ° C. for a long period of time (100, 500 or 1000 hours), the change in hardness and the mass loss rate (the same as described earlier) were measured, and the results are shown in Table 7. With respect to the hardness, sheets, each having a thickness of 1 mm, were laminated to a thickness of 10 mm to prepare a measuring sample, and this sample was measured by using an Asker rubber C-type hardness tester made by Koubunshi Keiki Co., Ltd. at 25° C. in compliance with a hardness test type-C indicated by JIS K 7312 (7). The pressing stylus of the hardness tester was pushed into the center of the sample so that the pressing face was made in close-contact with the sample; thus, the maximum indicated value within a second from the time of the close-contact was used as the hardness.

Based upon the initial hardness and the respective measured results on the hardness obtained after the sheet had been left in an oven heated to 130° C. for 100 hours, 500 hours and 1000 hours respectively, the change in hardness was calculated, and the value of the initial hardness and the change in hardness are shown in Table 7. The minus value in the change in hardness indicates that the sample becomes soft. As the change in hardness and the mass loss rate become smaller, the sheet heat resistance becomes better, making it possible to exert a stable heat-releasing property for a long period of time. Here, this evaluation on the heat resistance was carried out on each of the above-mentioned Nos. 4-1 to 4-4 and No. 4-5 for use in comparison, and the results are also shown in Table 7.

No. 4-7

The same processes as those of No. 4-6 were carried out except that in No. 4-6, 0.06 part of dibutyltin dilaurate serving as a crosslinking accelerator was changed to 0.01 part and that 0.1 part of N,N,N',N'-tetramethyl-1,6-hexane diamine (made by Tosoh Corporation; "TOYOCAT-MR") was used as a compound having an atom with a lone pair in its molecule so that a sheet for a thermal conductive material was obtained. The sheet moldability was superior as it was in No. 4-6, and the thermal conductivity was 1.8 W/m·K. The results of evaluations are shown in Table 7.

No. 4-8

The same processes as those of No. 4-7 were carried out except that in No. 4-7, the compound having an atom with a lone pair in its molecule was changed to 0.5 part of N,N,N'-trimethylaminoethylmethanol amine (made by Tosoh Corporation; "TEDA-RX5") so that a sheet for a thermal conductive material was obtained. The sheet moldability was superior as it was in No.4-7, and the thermal conductivity was 1.9 W/m·K. The results of evaluations are shown in Table 7.

No. 4-9

The same processes as those of No. 4-7 were carried out except that in No. 4-7, the compound having an atom with a lone pair in its molecule was changed to 0.5 part of hexamethyl phosphor amide so that a sheet for a thermal conductive material was obtained. The sheet moldability was superior as it was in No. 4-7, and the thermal conductivity was 1.7 W/m·K. The results of evaluations are shown in Table 7.

No. 4-10

The same processes as those of No. 4-7 were carried out except that in No. 4-7, the compound having an atom with a lone pair in its molecule was changed to 0.5 part of acetyl acetone so that a sheet for a thermal conductive material was obtained. The sheet moldability was superior as it was in No.4-7, and the thermal conductivity was 1.7 W/m·K. The results of evaluations are shown in Table 7.

TABLE 7

(Experiment 4)

| No. | Hardness measuring conditions | Initial hardness | Hardness change; 130° C. | | | Mass loss rate (%); 130° C. | | |
|---|---|---|---|---|---|---|---|---|
| | | | 100 hours later | 500 hours later | 1000 hours later | 100 hours later | 500 hours later | 1000 hours later |
| 4-1 | A-type: 25° C. | 60 | −2 | −7 | −15 | 0.7 | 1.2 | 2.5 |
| 4-2 | A-type: 25° C. | 20 | 0 | −2 | −9 | 0.9 | 2.1 | 3.5 |
| 4-3 | A-type: 25° C. | 45 | −1 | −5 | −13 | 0.8 | 1.5 | 2.9 |
| 4-4 | A-type: 25° C. | 62 | −2 | +3 | +15 | 0.7 | 1.2 | 2.6 |
| 4-5 | A-type: 25° C. | 65 | 0 | +13 | +28 | 1.9 | 2.9 | 4.6 |
| 4-6 | C-type: 25° C. | 45 | 0 | −2 | −18 | 0.55 | 0.64 | 0.78 |
| 4-7 | C-type: 25° C. | 46 | 0 | +1 | −3 | 0.54 | 0.63 | 0.72 |
| 4-8 | C-type: 25° C. | 45 | +1 | −2 | −6 | 0.50 | 0.66 | 0.77 |
| 4-9 | C-type: 25° C. | 47 | −2 | +1 | −3 | 0.53 | 0.62 | 0.78 |
| 4-10 | C-type: 25° C. | 48 | 0 | −2 | −5 | 0.56 | 0.69 | 0.80 |

As clearly indicated by Table 7, Examples of the present invention make it possible to provide a resin composition for thermal conductive material that is superior in thermal conductivity, flexibility and moldability efficiently. In contrast, Nos. 4 and 5 for use in comparison, which use a thermal softening agent without using an oily substance that is in a liquid state at normal temperature, are inferior in comparison with Examples of the present invention. Moreover, by using a compound having an atom with a lone pair in its molecule, it becomes possible to suppress the gel-state resin from deteriorating in hardness.

Experiment 5 (Experiments Relating to a Resin Composition in which Polymer (I) is a Crosslinking Polymer (I-b))

Synthesis Example 6

Into a container equipped with a thermometer, a stirring device, a gas introducing pipe, a reflux condenser and a dropping funnel were charged 39.22 parts of 2EHA, 0.78 part of 2-hydroxyethyl acrylate (with a hydroxyl-group-containing monomer being set to 3 mol % in the entire polymerizable monomers), 50 parts of trimellitic acid ester-based liquid-state plasticizer (the aforementioned "ADK-Cizer C880") and 0.15 part of a-methylstyrene dimer serving as a chain transfer agent, and the inner gas of the container was replaced with a nitrogen gas. This was heated to 75° C., and a mixture of 0.1 part of dimethyl 2,2'-azobis(2-methyl propionate) serving as a polymerization initiator and 10 parts of trimellitic acid-based ester liquid-state plasticizer (the aforementioned "ADK-Cizer C880") was charged into the dropping funnel, and dropped into the container in 1.5 hours. To this was further added 0.03 part of dimethyl-2,2'-azobis(2-methylpropionate), and the resulting mixture was heated to 90° C. and allowed to undergo a polymerization reaction for 2 hours.

Prior to the completion of the polymerization reaction, 0.05 part of dibutyltin dilaurate was added thereto as an organic metal compound, and air was blown thereto to cool the system so that the polymerization was completed; thus, a (meth)acrylic resin (hereinafter, referred to as resin 5-A) was obtained. The residual 2EHA, confirmed by gas chromatography (GC), was 0.1%, and the polymer containing 3-mol % hydroxyl group in the resin 5-A, was 39.9%. The viscosity of the resulting resin 5-A at 25° C. was 6100 mPa·s. With respect to the molecular weight of the polymer measured by GPC, the weight-average molecular weight Mw was 356000 and the number-average molecular weight Mn was 91000. Moreover, the glass transition point temperature of the polymer, measured by a differential scanning calorimeter according to a conventional method, was −60° C.

No. 5-1

The above-mentioned resin No. 5-A (100 parts), 0.1 part of an antifoamer (the aforementioned "A-515"), 0.57 part of hexamethylene diisocyanate (in which the amount of isocyanate was 1.0 equivalent to the amount of hydroxyl groups in the polymer), 0.25 part of acetic acid (boiling point: 119° C.) serving as an acidic compound and 200 parts of aluminum oxide having a thermal conductivity of 30 W/m·K (made by Showa Denko K.K.; Item No. AS-10) were uniformly kneaded at a rotation speed of 300 rpm for 5 minutes using a Three-one Motor (Item No. 600 G) made by Shinto Scientific Co., Ltd. The viscosity, pot life at 25° C. and defoaming property of the resulting resin composition were measured under conditions as described below, and the results are shown in Table 8.

[Viscosity]

The viscosity of the resulting resin composition at 25° C. was measured by using a B-type viscometer under conditions of rotor No. 4 and number of revolutions of 6 rpm. When the viscosity is set to a low level, the resulting resin composition not only achieves a superior operability, but also allows a thermal conductive filler to be filled in a high proportion; thus, it becomes possible to improve the heat-radiating property (thermal conduction), and also to achieve an easy defoaming performance, which easily removes air contained in the resin composition upon manufacturing.

[Pot Life at 25° C.]

The resulting resin composition was stored in a water vessel that was temperature-adjusted to 25° C., and subjected to a viscosity measurement with elapsed time under the same condition as the above viscosity measurement so that the time at which a viscosity increase of 20% or more from the initial viscosity value has been confirmed was defined as the pot life (applicable time). Here, in the case when the viscosity increase after an elapsed time of 8 hours was less than 10%, this case was evaluated as 8 hours or longer. For example, when the applicable time is longer, a large amount of production was available at one lot, making it possible to provide a superior resin composition in economical efficiency.

[Defoaming Property]

The resulting resin composition was placed still in a reduced-pressure desiccator set to 0.09 MPa in its degree of vacuum, and defoaming processes were respectively carried out for 2 minutes, 5 minutes and 10 minutes so that the presence of bubbles contained in each of the resin compositions was visually observed. When no bubbles were visually observed, this case was defined as ◯, and when even slight bubbles were observed, this case was defined as X. For example, when no bubbles are observed even after a short period of defoaming process, it becomes possible to provide a superior resin composition in productivity.

Next, the resulting resin composition was subjected to a defoaming process for 2 minutes as well as for 10 minutes under the following defoaming conditions, and each of these was then applied to a PET film that had been subjected to a releasing treatment, by using a bar coater designed to prepare a thickness of 1 mm. Next, each of these coated products was heated at 100° C. for two hours so that the polymer having a hydroxyl group in the composition was allowed to react with hexamethylene diisocyanate to provide a sheet-shaped cured product of the resin composition. The moldability of the sheet thus obtained was evaluated in the same manner as in the aforementioned Experiment 1. The results are shown in Table 8. Moreover, with respect to the sheet obtained through the defoaming time of 10 minutes, the initial thermal conductivity, sheet initial hardness, heat resistance and durability were evaluated in the same manner as in the aforementioned Experiment 1. Here, the evaluation on heat resistance was conducted at 100° C. for 168 hours. The results are shown in Table 8.

No. 5-2

The same processes as those of No. 5-1 were carried out except that the acidic compound was changed from acetic acid to propionic acid (boiling point 141° C.) (0.25 part) so that a resin composition and a sheet-shaped cured product of the resin composition were obtained. These were evaluated in the same manner as in No. 5-1, and the results are shown in Table 8.

No. 5-3

The same processes as those of No. 5-1 were carried out except that the amount of the thermal conductive filler was changed from 200 parts to 300 parts so that a resin composition and a sheet-shaped cured product of the resin composition were obtained. These were evaluated in the same manner as in No. 5-1, and the results are shown in Table 8.

No. 5-4 (for use in Comparison)

The same process as those of No. 5-1 were carried out except that no acidic compound was used so that a resin composition and a sheet-shaped product of the resin composition were obtained. These were evaluated in the same manner as in No. 5-1, and the results are shown in Table 8. When compared with any one of the examples of the present invention, the resulting resin composition had higher viscosity, was inferior in operability, took a longer period of time so as to be completely defoamed, and had a shorter pot life. Consequently, these were inferior in productivity and caused high costs in comparison with any one of Examples of the present invention.

Moreover, the cured product made by setting the defoaming time to 2 minutes was inferior in moldability. It is considered that this is caused by bubbles contained in the cured product.

No. 5-5 (for use in Comparison)

The same process as those of No. 5-1 were carried out except that no acidic compound was used and that the amount of the thermal conductive filler was changed from 200 parts to 300 parts so that a resin composition and a sheet-shaped product of the resin composition were obtained. These were evaluated in the same manner as in No. 5-1, and the results are shown in Table 8. The resulting resin composition had insufficient dispersion of the filler and higher viscosity in comparison with any of Examples of the present invention (exceeding the upper measuring limit of the device to become unmeasurable), and even when the defoaming time was set to 10 minutes, the presence of bubbles was observed. Moreover, it was confirmed that the pot life was shorter in comparison with any one of Examples of the present invention. Consequently, these were inferior in productivity and caused high costs. Furthermore, it was confirmed that the resulting cured product was inferior in moldability and had a poor thermal conductive performance. It is considered that this was caused by bubbles contained in the cured product.

Here, the meanings of abbreviations used in Table 8 are explained as follows:

HDI: Hexamethylene diisocyanate

A-515: Antifoamer made by BYK-Chemie Japan KK, tradename: "A-515"

Δhardness: Hardness difference between a sheet initial hardness value and the sheet hardness value after the heat-resistant test

TABLE 8

(Experiment 5)

| | No. | | | | |
|---|---|---|---|---|---|
| | 5-1 | 5-2 | 5-3 | 5-4 | 5-5 |
| Resin 5-A | 100 | 100 | 100 | 100 | 100 |
| HDI | 0.57 | 0.57 | 0.57 | 0.57 | 0.57 |
| A-515 | 0.1 | 0.1 | 0.1 | 0.1 | 0.1 |
| Acetic acid | 0.25 | 0 | 0.25 | 0 | 0 |
| Propionic acid | 0 | 0.25 | 0 | 0 | 0 |
| Alumina oxide | 200 | 200 | 200 | 200 | 200 |
| Viscosity (Pa · s) | 20.5 | 21.5 | 46.9 | 50.2 | Unmeasurable |
| Defoaming property | | | | | |
| 2 minutes | ◯ | ◯ | ◯ | X | X |
| 5 minutes | ◯ | ◯ | ◯ | X | X |
| 10 minutes | ◯ | ◯ | ◯ | ◯ | X |
| Pot life (25° C.) | 8 hours or more | 8 hours or more | 8 hours or more | 1 hr | 0.5 hr |
| Sheet moldability | | | | | |
| 2 minutes | ◯ | ◯ | ◯ | x1 | x2 |
| 10 minutes | ◯ | ◯ | ◯ | ◯ | x2 |
| Sheet initial hardness (C-type) | 12 | 11 | 23 | 12 | 30 |
| Sheet initial thermal conductivity (W/m · K) | 0.85 | 0.81 | 1.20 | 0.85 | 0.95 |
| Heat resistance | | | | | |
| Mass loss rate (%) | 0.15 | 0.12 | 0.11 | 0.12 | 0.13 |
| Sheet hardness (C-type) | 12 | 12 | 25 | 13 | 33 |
| Thermal conductivity (W/m · K) | 0.88 | 0.82 | 1.23 | 0.82 | 0.91 |
| Durability (Δ hardness) | 0 | 1 | 2 | 1 | 3 | x1: Irregularities and bubbles were observed on the sheet surface.
x2: Separated liquid-state plasticizer appeared on the surface, or separation and precipitation of the filler were observed.

As clearly indicated by Table 8, Examples of the present invention make it possible to efficiently provide a cured product (thermal conductive material) for thermal conductive material that is superior in operability and productivity upon producing a composition for a thermal conductive material, and achieves superior moldability, flexibility, thermal conductivity and decay durability. In comparison with Examples of the present invention, any of Comparative Examples are inferior in operability and productivity upon producing a composition for a thermal conductive material, and the resulting cured products are also inferior in moldability and thermal conductivity.

INDUSTRIAL APPLICABILITY

By using the resin composition of the present invention, it becomes possible to obtain a thermal conductive material that is superior in thermal conductivity and flexibility. Therefore, this material is effectively used as a thermal conductive material that is interposed between a heat-generating body, such as an electric and an electronic part and a heat-radiating body, such as a heat sink, a radiating fin and a metal heat radiating plate, so that heat generated in the electric and electronic parts is radiated. Moreover, this material is also applied as various other heat conductive materials.

The invention claimed is:

1. A resin composition for a thermal conductive material, comprising:
   a polymer (I), a liquid-state plasticizer (II), a thermal conductive filler (III) having a thermal conductivity of 20 W/m·K or more, and an antifoamer,
   wherein the liquid-state plasticizer (II) is in a liquid state at 25° C., and has a mass loss rate of 2 mass % or less when kept at 130° C. for 24 hours,
   wherein the polymer (I) is a (meth)acrylic polymer (I-a), and further comprises a polymerizable monomer (IV),
   wherein the (meth)acrylic polymer (I-a) has a mass-average molecular weight (Mw) in a range from 10,000 to 1,000,000, and is obtained by radical polymerization using a chain transfer agent, and
   wherein when supposing that the total of the (meth)acrylic polymer (I-a) and polymerizable monomer (IV) is 100% by mass, the (meth)acrylic polymer (I-a) is present in a range from 10 to 80% by mass, and the polymerizable monomer (IV) is present in a range from 20 to 90% by mass.

2. The resin composition for a thermal conductive material according to claim 1, wherein a viscosity of the liquid-state plasticizer (II) at 25° C. is set to 1000 mPa·s or less.

3. The resin composition for a thermal conductive material according to claim 1, wherein the radical polymerization takes place in the presence of the liquid-state plasticizer (II).

4. The resin composition for a thermal conductive material according to claim 1, wherein the (meth)acrylic polymer (I-a) has a glass transition point of 0° C. or less, and at least one portion of the polymerizable monomer (IV) is composed of a (meth)acrylic acid alkyl ester wherein an alkyl group has 2 to 18 carbon atoms.

5. The resin composition for a thermal conductive material according to claim 1, further comprising a radical polymerization initiator (V).

6. A resin composition for a thermal conductive material, comprising:
   a polymer (I), a liquid-state plasticizer (II), a thermal conductive filler (III) having a thermal conductivity of 20 W/m·K or more, and an antifoamer,
   wherein the liquid-state plasticizer (II) is in a liquid state at 25° C., and has a mass loss rate of 2 mass % or less when kept at 130° C. for 24 hours,
   wherein the polymer (I) is a crosslinking polymer (I-b), and comprises a crosslinking agent (VI) capable of reacting with the crosslinking polymer (I-b).
   wherein the crosslinking polymer (I-b) is obtained by radical polymerization using a chain transfer agent, wherein a polymerizable monomer (I-b-1) is copolymerized with a polymerizable monomer (I-b-2) having a functional group for crosslinking, and the polymerizable monomer (I-b-2) is contained in a range from 0.01 to 5 mole % based on 100 mole % of the total amount of the polymerizable monomer (I-b-1) and the polymerizable monomer (I-b-2), and
   wherein a mass-average molecular weight (Mw) of the polymer (I-b) is in a range of from 100,000 to 1,000,000.

7. The resin composition for a thermal conductive material according to claim 6, wherein the functional group of the polymerizable monomer (I-b-2) is a hydroxyl group, and
   the crosslinking agent (VI) is a compound containing an isocyanate group, and which further comprises an organic compound and a compound having an atom with a lone pair in the molecule thereof as a catalyst used for the reaction between the crosslinking agent (VI) and the crosslinking polymer (I-b).

8. The resin composition for a thermal conductive material according to claim 6, further comprising an acidic compound.

9. A thermal conductive material, which is formed by curing the resin composition for a thermal conductive material according to claim 1.

10. The thermal conductive material according to claim 9, which has a mass loss rate of 5% by mass or less when held at 130° C. for 168 hours.

11. A material for the resin composition for a thermal conductive material according to claim 3, comprising:
   the liquid-state plasticizer, the (meth)acrylic polymer (I-a) and the polymerizable monomer (IV).

12. A material for the resin composition for a thermal conductive material according to claim 6, comprising:
   the liquid-state plasticizer (II) and the crosslinking polymer (I-b).

13. The resin composition for a thermal conductive material according to claim 3, wherein the (meth)acrylic polymer (I-a) has a glass transition point of 0° C. or less, and at least one portion of the polymerizable monomer (IV) is composed of a (meth)acrylic acid alkyl ester wherein an alkyl group has 2 to 18 carbon atoms.

14. The resin composition for a thermal conductive material according to claim 3, further comprising a radical polymerization initiator (V).

15. The resin composition for a thermal conductive material according to claim 4, further comprising a radical polymerization initiator (V).

16. The resin composition for a thermal conductive material according to claim 6, wherein a viscosity of the liquid-state plasticizer (II) at 25° C. is set to 1000 mPa·s or less.

17. The resin composition for a thermal conductive material according to claim 7, further comprising an acidic compound.

18. The resin composition for a thermal conductive material according to claim 1, wherein the chain transfer agent is selected from the group consisting of α-methylstyrene, α-methylstyrene dimer and thiol compounds.

19. The resin composition for a thermal conductive material according to claim 6, wherein the chain transfer agent is selected from the group consisting of α-methylstyrene, α-methylstyrene dimer and thiol compounds.

20. The resin composition for a thermal conductive material according to claim 1, wherein the chain transfer agent is used in a range from 0.01 to 2 parts by mass with respect to 100 parts by mass of a monomer component constituting the (meth)acrylic polymer (I-a).

21. The resin composition for a thermal conductive material according to claim 6, wherein the chain transfer agent is used in a range from 0.01 to 2 parts by mass with respect to 100 parts by mass of the total amount of the polymerizable monomer (I-b-1) and the polymerizable monomer (I-b-2).

* * * * *